United States Patent
Lin et al.

(10) Patent No.: US 8,558,383 B2
(45) Date of Patent: Oct. 15, 2013

(54) POST PASSIVATION STRUCTURE FOR A SEMICONDUCTOR DEVICE AND PACKAGING PROCESS FOR SAME

(75) Inventors: Mou-Shiung Lin, Hsinchu (TW); Chien-Kang Chou, Tainan Hsien (TW); Ke-Hung Chen, Kaohsiung (TW)

(73) Assignee: Megica Corporation, Hsinchu (TW)

( * ) Notice: Subject to any disclaimer, the term of this patent is extended or adjusted under 35 U.S.C. 154(b) by 395 days.

(21) Appl. No.: 12/264,271

(22) Filed: Nov. 4, 2008

(65) Prior Publication Data
US 2009/0057895 A1 Mar. 5, 2009

Related U.S. Application Data

(63) Continuation of application No. 11/430,513, filed on May 8, 2006, now Pat. No. 7,468,545.

(60) Provisional application No. 60/678,525, filed on May 6, 2005, provisional application No. 60/693,549, filed on Jun. 24, 2005.

(51) Int. Cl.
*H01L 23/48* (2006.01)
*H01L 23/52* (2006.01)
*H01L 29/40* (2006.01)

(52) U.S. Cl.
USPC ............ 257/758; 257/773; 257/E23.145

(58) Field of Classification Search
USPC ......... 257/700, 758, 773, E21.17, 737, 738, 257/E23.145; 438/107, 125
See application file for complete search history.

(56) References Cited

U.S. PATENT DOCUMENTS

| | | |
|---|---|---|
| 5,226,232 A | 7/1993 | Boyd |
| 5,565,706 A | 10/1996 | Miura et al. |
| 5,615,824 A | 4/1997 | Fjelstad et al. |
| 5,631,499 A | 5/1997 | Hosomi et al. |
| 5,641,990 A | 6/1997 | Chiu |

(Continued)

FOREIGN PATENT DOCUMENTS

| | | |
|---|---|---|
| CN | 1560911 | 1/2005 |
| EP | 1387402 | 2/2004 |

(Continued)

OTHER PUBLICATIONS

Baba et al. ("Molded Chip Scale Package for High Pin Count", IEEE Trans. on Components, Packaging, and Manufacturing Tech., Part B, vol. 21, No. 1, Feb. 1998).*

(Continued)

*Primary Examiner* — Hoai V Pham
(74) *Attorney, Agent, or Firm* — Seyfarth Shaw LLP

(57) ABSTRACT

A post passivation rerouting support structure comprises a relatively thin support layer above the passivation layer to support the RDL, and a relatively thick support layer for fine pitch interconnects extending from the RDL and terminating as contact structures at the surface of the thick support layer, for a next level packaging structure. The thick support layer is planarized before defining the contact structures. The thick support layer may be formed after the conducting posts have been formed, or the thick support layer is formed before forming the conducting posts in vias formed in the thick support layer. An encapsulating layer may be provided above the thick support layer, which top surface is planarized before defining the contact structures. The encapsulating layer and the further support layer may be the same layer.

20 Claims, 11 Drawing Sheets

(56) References Cited

U.S. PATENT DOCUMENTS

| | | | |
|---|---|---|---|
| 5,745,984 A | 5/1998 | Cole, Jr. et al. | |
| 5,801,446 A | 9/1998 | DiStefano | |
| 5,883,435 A | 3/1999 | Geffken et al. | |
| 5,885,849 A | 3/1999 | DiStefano | |
| 5,959,256 A | 9/1999 | Saida et al. | |
| 5,960,316 A | 9/1999 | Bai | |
| 5,980,270 A | 11/1999 | Fjelstad | |
| 6,013,571 A | 1/2000 | Morrell | |
| 6,022,758 A | 2/2000 | Badehi | |
| 6,077,726 A | 6/2000 | Mistry et al. | |
| 6,103,552 A * | 8/2000 | Lin | 438/113 |
| 6,144,100 A | 11/2000 | Shen et al. | |
| 6,154,366 A | 11/2000 | Ma et al. | |
| 6,162,661 A | 12/2000 | Link | |
| 6,187,680 B1 * | 2/2001 | Costrini et al. | 438/688 |
| 6,200,888 B1 | 3/2001 | Ito et al. | |
| 6,229,711 B1 | 5/2001 | Yoneda | |
| 6,253,992 B1 | 7/2001 | Fjelstad | |
| 6,284,656 B1 | 9/2001 | Farrar | |
| 6,291,268 B1 * | 9/2001 | Ho | 438/108 |
| 6,294,405 B1 | 9/2001 | Higgins, III | |
| 6,303,486 B1 | 10/2001 | Park | |
| 6,324,754 B1 | 12/2001 | DiStefano | |
| 6,326,701 B1 * | 12/2001 | Shinogi et al. | 257/797 |
| 6,329,605 B1 | 12/2001 | Beroz | |
| 6,335,222 B1 | 1/2002 | DiStefano | |
| 6,365,971 B1 | 4/2002 | Bai | |
| 6,380,060 B1 | 4/2002 | Zohni | |
| 6,383,916 B1 | 5/2002 | Lin | |
| 6,387,734 B1 * | 5/2002 | Inaba et al. | 438/125 |
| 6,387,793 B1 * | 5/2002 | Yap et al. | 438/612 |
| 6,426,281 B1 | 7/2002 | Lin et al. | |
| 6,465,747 B2 | 10/2002 | DiStefano | |
| 6,479,900 B1 * | 11/2002 | Shinogi et al. | 257/758 |
| 6,492,251 B1 | 12/2002 | Haba | |
| 6,495,442 B1 | 12/2002 | Lin et al. | |
| 6,495,916 B1 | 12/2002 | Ohuchi et al. | |
| 6,501,169 B1 | 12/2002 | Aoki et al. | |
| 6,518,092 B2 | 2/2003 | Kikuchi | |
| 6,545,354 B1 | 4/2003 | Aoki et al. | |
| 6,607,970 B1 | 8/2003 | Wakabayashi | |
| 6,639,299 B2 | 10/2003 | Aoki | |
| 6,673,698 B1 | 1/2004 | Lin et al. | |
| 6,674,162 B2 * | 1/2004 | Takao | 257/700 |
| 6,683,380 B2 | 1/2004 | Efland et al. | |
| 6,707,159 B1 | 3/2004 | Kumamoto et al. | |
| 6,709,469 B1 | 3/2004 | Link | |
| 6,724,638 B1 | 4/2004 | Inagaki et al. | |
| 6,762,122 B2 | 7/2004 | Mis et al. | |
| 6,765,299 B2 | 7/2004 | Takahashi et al. | |
| 6,770,971 B2 | 8/2004 | Kouno et al. | |
| 6,784,087 B2 | 8/2004 | Lee et al. | |
| 6,809,020 B2 | 10/2004 | Sakurai et al. | |
| 6,818,545 B2 | 11/2004 | Lee et al. | |
| 6,828,510 B1 | 12/2004 | Asai et al. | |
| 6,828,668 B2 | 12/2004 | Smith et al. | |
| 6,847,066 B2 | 1/2005 | Tahara et al. | |
| 6,853,076 B2 | 2/2005 | Datta et al. | |
| 6,864,565 B1 * | 3/2005 | Hool et al. | 257/666 |
| 6,870,267 B2 | 3/2005 | Zohni | |
| 6,924,551 B2 | 8/2005 | Rumer et al. | |
| 6,940,169 B2 | 9/2005 | Jin et al. | |
| 6,952,048 B2 * | 10/2005 | Terui | 257/678 |
| 6,969,910 B2 | 11/2005 | Chinda | |
| 7,012,339 B2 | 3/2006 | Terui | |
| 7,029,953 B2 | 4/2006 | Sasaki | |
| 7,045,899 B2 | 5/2006 | Yamane et al. | |
| 7,078,819 B2 | 7/2006 | DiStefano | |
| 7,188,413 B2 | 3/2007 | Jamil | |
| 7,196,014 B2 | 3/2007 | Dalton et al. | |
| 7,208,834 B2 | 4/2007 | Lee et al. | |
| 7,220,657 B2 | 5/2007 | Ihara et al. | |
| 7,239,028 B2 | 7/2007 | Anzai | |
| 7,351,915 B2 | 4/2008 | Ahn et al. | |
| 7,443,036 B2 * | 10/2008 | Iwasaki et al. | 257/777 |
| 7,468,545 B2 | 12/2008 | Lin et al. | |
| 2001/0040290 A1 | 11/2001 | Sakurai et al. | |
| 2002/0043723 A1 | 4/2002 | Shimizu et al. | |
| 2002/0070443 A1 | 6/2002 | Mu et al. | |
| 2002/0084521 A1 * | 7/2002 | Coyle et al. | 257/690 |
| 2002/0096757 A1 * | 7/2002 | Takao et al. | 257/690 |
| 2002/0102765 A1 * | 8/2002 | Lahiri et al. | 438/98 |
| 2002/0121692 A1 * | 9/2002 | Lee et al. | 257/737 |
| 2002/0190107 A1 | 12/2002 | Shah et al. | |
| 2003/0006062 A1 | 1/2003 | Stone et al. | |
| 2003/0038331 A1 | 2/2003 | Aoki et al. | |
| 2003/0111711 A1 | 6/2003 | Lin et al. | |
| 2003/0134455 A1 | 7/2003 | Cheng et al. | |
| 2003/0218246 A1 | 11/2003 | Abe et al. | |
| 2004/0007779 A1 | 1/2004 | Arbuthnot et al. | |
| 2004/0094841 A1 * | 5/2004 | Matsuzaki et al. | 257/758 |
| 2004/0140556 A1 | 7/2004 | Lin et al. | |
| 2004/0168825 A1 | 9/2004 | Sakamoto et al. | |
| 2005/0024912 A1 | 2/2005 | Chen et al. | |
| 2005/0098891 A1 * | 5/2005 | Wakabayashi et al. | 257/758 |
| 2005/0112800 A1 * | 5/2005 | Yamano | 438/113 |
| 2005/0151130 A1 | 7/2005 | Stasiak | |
| 2005/0176233 A1 | 8/2005 | Joshi et al. | |
| 2007/0205520 A1 * | 9/2007 | Chou et al. | 257/780 |
| 2008/0121943 A1 | 5/2008 | Lin et al. | |
| 2009/0057895 A1 | 3/2009 | Lin et al. | |

FOREIGN PATENT DOCUMENTS

| | | |
|---|---|---|
| EP | 1536469 | 6/2005 |
| JP | 09045691 | 2/1997 |
| JP | 2000183090 | 6/2000 |
| JP | 2000228423 | 8/2000 |
| WO | WO2005024912 | 3/2005 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

(56) References Cited

OTHER PUBLICATIONS

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

European Search Report for European Patent Application No. 06012984.8 dated Jul. 18, 2008.

\* cited by examiner

POST PASSIVATION STRUCTURE FOR A SEMICONDUCTOR DEVICE AND PACKAGING PROCESS FOR SAME

INCORPORATION BY REFERENCE

This application is a continuation of Ser. No. 11/430,513, filed on May 8, 2006, now issued as U.S. Pat. No. 7,468,545, which claims the priority of U.S. Provisional Application No. 60/678,525, filed May 6, 2005 and U.S. Provisional Application No. 60/693,549, filed Jun. 24, 2005. These documents are fully incorporated by reference as if fully set forth herein.

The publications noted in the disclosure herein are each fully incorporated by reference, as if fully set forth in its entirety herein.

BACKGROUND OF THE INVENTION

1. Field of the Invention

The present invention relates to semiconductor devices, particularly to structures of semiconductor devices, and more particularly to post passivation structures for semiconductor devices and packaging processes for such.

2. Description of Related Art

Semiconductor wafers are processed to produce IC (integrated circuit) chip having ever-increasing device density and shrinking feature geometries. Multiple conductive and insulating layers are required to enable the interconnection and isolation of the large number of semiconductor devices in different layers (e.g., active and passive devices, such as TFT, CMOS, capacitors, inductors, resistors, etc). Such large scale integration results in increasing number of electrical connections between various layers and semiconductor devices. It also leads to an increasing number of leads to the resultant IC chip. These leads are exposed through a passivation layer of the IC chip, terminating in I/O pads that allow connections to external contact structures in a chip package.

Wafer-Level Packaging (WLP) refers to the technology of packaging an IC chip at wafer level, instead of the traditional process of assembling the package of each individual unit after wafer dicing. WLP allows for the integration of wafer fabrication, packaging, test, and burn-in at the wafer level, before being singulated by dicing for final assembly into a chip carrier package (e.g., a ball grid array (BGA) package). The advantages offered by WLP include smaller size (reduced footprint and thickness), lesser weight, relatively easier assembly process, lower overall production costs, and improvement in electrical performance. WLP therefore streamlines the manufacturing process undergone by a device from silicon start to customer shipment. While WLP is a high throughput and low cost approach to IC chip packaging, it however invites significant challenges in manufacturability and structural reliability.

WLP basically consists of extending the wafer fabrication processes to include device interconnection and device protection processes. The first step to WLP is to enlarge the pad pitch of standard ICs by redistribution technology post passivation of the IC semiconductor structure. Low cost stencil printing of solder or placing preformed solder balls is then possible. Examples of redistribution technology are disclosed, for example, in U.S. Pat. No. 6,642,136; U.S. Pat. No. 6,784,087; and U.S. Pat. No. 6,818,545, commonly assigned to the assignee of the present invention. As disclosed in these patents, a redistribution layer (RDL) contacts the I/O pad of the semiconductor structure. The RDL is supported on a layer of polymer or elastomer deposited over a passivation layer. A contact post is formed on the RDL, using a photo-masking process. The resultant contact post is freestanding, unsupported on its lateral sides. The resultant structure can be further assembled into a chip carrier package using flip chip assembly technique. While the post passivation structures and related processes provide for IC packaging with improved pitch resolution, there is still a limitation to meeting the increasing demand for finer pitch resolution in view of the ever increasing scale of integration in ICs. There is also potential risk for stress-induced failures, as noted below.

U.S. Pat. No. 6,103,552 discloses another WLP process including a post passivation RDL. The RDL is supported on a layer of polymeric material that is deposited on the passivation layer of the semiconductor structure. Another polymeric layer is deposited over the RDL, and etched or drilled to provide a via for over-filling with a metal to form an interconnect (i.e., a conducting post) that extends above and beyond the opening of the via. The top polymeric layer and the bottom polymeric layer are separated by a layer of chrome-copper, and therefore do not touch between the RDL structures. A solder bump attached to the protruding end of the post is formed by electroless plating, screen or stencil printing. Because the post extends beyond the surface of the polymeric layer, and the top surface of the structure is otherwise not smooth, high-resolution lithography cannot be achieved to form the vias for the conductive posts and to plate the solder bumps. Consequently, the pitch of the contacts for the IC package would be limited. This limitation would be more pronounced with an increase in thickness of the polymeric layer, which otherwise may be desirable to provide better stress relief, as discussed below. Further, as noted, the bottom polymeric layer is separate from the top polymeric layer, therefore the bottom polymeric layer alone does not provide good stress relief. If the bottom polymeric layer is made thin to reduce lateral RDL displacements, stress relief would be poor, leading to issues further discussed below.

One of the challenges to structural reliability includes providing adequate stress relief in the resultant WLP processed multilayered structure, including the semiconductor IC die and the additional post passivation structure. For example, the thin film bonded on the passivation layer is subject to biaxial stress that is thermally induced. Equation (1) represents a theoretical mathematical modeling of the biaxial thermal stress in the post passivation thin film in relationship to various physical parameters of the bonded structure on a silicon (Si) substrate:

$$\sigma_{ppt} = \frac{1}{6R} \frac{Y_s x_{Si}^2}{(1-v_{Si})x_{ppt}} \qquad \text{Equation (1)}$$

where:
$\sigma_{ppt}=\sigma_x=\sigma_y$; biaxial stress in the post passivation thin film;
R=radius of curvature of the Si substrate caused by thermal stress;
$Y_s$=Young's modulus of Si substrate;
$v_{si}$=Poisson's ratio of Si substrate;
$x_{Si}$=thickness of Si substrate; and
$x_{ppt}$=thickness of the post-passivation thin film.

Based on the above formula, there are two ways to lowering the biaxial stress $\sigma_{ppt}$ (in addition to increasing $v_{si}$): (a) lower $x_{Si}$, which means making the Si substrate thinner; or (b) increase $x_{ppt}$, which means increasing the thickness of the post-passivation thin film structure.

FIG. 1 schematically shows a prior art post passivation structure 10, including an RDL 12 and a stress-relieving polymer (or stress buffer) layer 14, formed over a passivation layer 16 at the top layer of the semiconductor IC chip 18. The polymer layer 14 is made of, for example, an elastomer, epoxy, low-K dielectric material, or other polymer. Elastomer is used mainly for providing sufficient mechanical flexibility for the bonded structure. As can also be deduced from Equation (1) above, when a polymer layer is deposited over an IC chip 18, the stress generated by the chip and the structure bonded thereto can be absorbed or buffered to reduce local damage to the chip; this in turn enhances the reliability of the structure 10, especially the delicate circuits in the IC chip. According to the relationship set forth in Equation (1), the performance of this buffering effect is increased as the thickness of the polymer layer increases.

There is a generic problem associated with using a thick polymer layer. The RDL 12 shown in FIG. 1 is typically made of copper; it is intended to connect IC I/O pads 20 on the IC chip 18 to external circuitry. When deposited with solder bumps and/or provided with copper conductive post atop at pads 22, the RDL 12 can be bonded to the next level packaging structure firmly (e.g., a chip carrier). The RDL 12 escalates from a lower plane (i.e., the plane with the IC I/O pads 20) to a higher one (the top of the polymer) via a sloping ramp 22 defined by the polymer layer 14. The slope in the ramp 22 is desired for metal step coverage on the sidewall of the thick opening in the polymer layer 14. In practice, the slope of the ramp 22 could vary for each opening in the polymer layer 14, depending on the actual process conditions and inherent physical properties and characteristics of the polymer (e.g., wetting angle, which has to do with the surface energy of the materials). For example, in many cases the slope of the ramp 22 in the polymer layer 14 on the IC passivation layer 16 can be as low as about 45°. Consequently, the RDL 12 must necessarily translate by a significant amount of lateral displacement to extend from the IC I/O pad 20 to the top of the thick layer of polymer 14. Consequently, this lateral displacement necessitates the allowance of a significant amount of tolerance in the layout of the RDL 12. As a result of the tolerance allowance necessary to accommodate the varying slopes of ramps for different openings in the polymer layer 14 and the varying lateral displacements of RDLs, the pitch between adjacent contact structures (e.g., defined by solder bumps and/or copper posts) on the RDLs is limited, and the distances between the contact structures and the openings in the passivation layer are increased. This results in a post passivation structure that does not have fine pitch structures for the next level of packing structure. On the other hand, if a thick layer of polymer is not used, stress buffering would not be sufficient, leading to possible stress induced failure of the delicate circuits in the IC chip. Further, there would be insufficient lateral support to tall conductive posts, resulting in limited pitch of the I/O structures. It is desirable to have tall conductive posts, as they provide sufficient distance to reduce capacitance coupling between the I/O pads 22 and the electrical circuits in the IC chip 18.

The issues noted above collectively placed a limitation on reducing the pitch of the contact structures achievable on the post passivation structures, and thus also a limitation on increasing the scale of integration of ICs.

It is desirable to provide a WLP structure, and a process relating to same, that allows for both improved stress relief and fine pitch contact structures.

SUMMARY OF THE INVENTION

The present invention overcomes the drawbacks of the prior art, by providing post passivation structures and related processes that accommodate both stress relief and fine pitch contact structures. In accordance with the present invention, a pitch of <250 µm, and a pin count of >400 may be achieved for the IC packaging.

In one aspect, the present invention provides a post passivation rerouting support structure that comprises a relatively thin support layer (e.g., a polymer layer) above the passivation layer to support fine pitch rerouting structures, and in addition a relatively thick support layer (e.g., a polymer layer) for the fine pitch rerouting structures for next level packaging structure.

The fine pitch rerouting structure may include RDL and fine pitch interconnects (e.g., conducting posts) extending from the RDL and terminating as contact structures at the surface of the thick support layer, for the next level packaging structure. The thick support layer may comprise a single layer or multiple layers of sub-layers. The thick support layer connects with the thin support layer at sections between the RDLs, which together form a thick support structure comprising a thin section and a thick section separated by the RDLs. A further support layer may be provided on the thick support layer, to provide stress relief with respect to further structures deposited thereon. In one embodiment, the thick support layer is formed after the conducting posts have been formed. In another embodiment, the thick support layer is first formed, and the conducting posts are formed in vias formed in the thick support layer.

In another aspect, the present invention provides a planarized (e.g., polished) surface on the thick support layer before defining the contact structures. In the alternative, optionally, and/or in addition, an encapsulating layer is provided above the thick support layer, which top surface is planarized before defining the contact structures. The encapsulating layer and the further support layer may be the same layer.

In accordance with the present invention, the thin support layer serves to provide a thin ramp for step coverage by the RDL, which results in reduced lateral displacements of the RDL even for small ramp slopes, and consequently fine pitch contact structures for a next level packaging structure. Further, the overall thick support structure serves to provide support to the fine pitch conducting posts and relieve stress in the bonded structure above the semiconductor device (e.g., an IC chip). For example, the stress generated by the bonded structure between the semiconductor device and a next level packaging structure (e.g., BGA carrier package substrate) can be accommodated by the thick polymer layer. Such stress can be generated by, for example, the mismatch of thermal expansion between two bonded structures, namely the carrier package substrate and the silicon substrate. Malfunction due to mechanical failure of the IC chips thus can be reduced. Still further, the thick support structure serves to electrically decouple the semiconductor device from the external contact structures and other electrical circuits and structures in the next level packaging structure, as there is reduced capacitance in view of the thick layer. Yet further, the planarized thick support layer and/or encapsulating layer provides a smooth surface that allows for high resolution lithography and electroplating processes to define fine pitch structures (e.g., contact structures such as solder bumps, and/or under bump metallization (UBM)). By forming the conductive posts prior to forming the thick support layer, the top surface of the structure may be planarized to expose the conductive posts. Electroplating using high-resolution lithography would achieve better resolution than the limited resolution achievable by conventional printing processes or robotic devices in a solder ball placement process.

In addition to the foregoing advantages of achieving fine pitch, stress-buffering, and electrical-decoupling layer for the semiconductor device, the present invention further provides an excellent foundation for different types of post passivation structures, including contact structures for a next level packaging structure, such as solder bumps, solder pads, Au bumps, high bandwidth conductive channels, etc., and active and passive elements, such as capacitors and inductors, which may be in a multilayer structure above the passivation layer.

BRIEF DESCRIPTION OF THE DRAWINGS

For a fuller understanding of the nature and advantages of the invention, as well as the preferred mode of use, reference should be made to the following detailed description read in conjunction with the accompanying drawings. In the following drawings, like reference numerals designate like or similar parts throughout the drawings.

DETAIL DESCRIPTION

Figure 1:
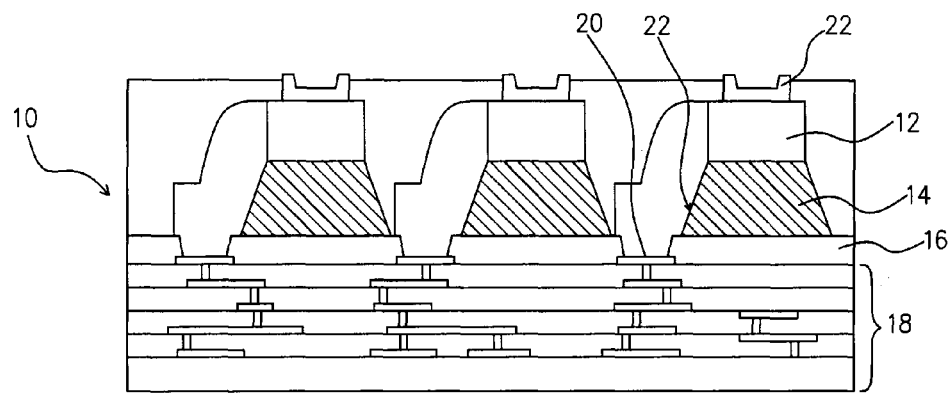
FIG. 1 is a schematic sectional view illustrating a post passivation structure in accordance with the prior art.

The present description is of the best presently contemplated mode of carrying out the invention. This description is made for the purpose of illustrating the general principles of the invention and should not be taken in a limiting sense. The scope of the invention is best determined by reference to the appended claims. This invention has been described herein in reference to various embodiments and drawings. It will be appreciated by those skilled in the art that variations and improvements may be accomplished in view of these teachings without deviating from the scope and spirit of the invention.

For purposes of illustrating the principles of the present invention and not by limitation, the present invention is described herein below by reference to structures and processes relating to WLP of IC chips. However, it is understood that the present invention is equally applicable to structures of other types of semiconductor devices, and other types of semiconductor packaging processes, without departing from the scope and spirit of the present invention.

It is noted that the description herein below refers to various layers arranged on, above or overlying other layers, to describe the relative positions of the various layers. Unless specifically required and/or to the extent consistent with the features, functions and purposes of the present invention disclosed herein, references to "on", "above", "overlying", "under", "support", "supported by or on", or other language of similar nature, are not limited to the interpretation of one layer being immediately adjacent to another layer, and does not preclude the presence of intermediate layers. There may be intermediate or interposing layers of materials, buffer layers, primer layers, seed layers, adhesives, coatings, textures, surface finishes, or other structures present between the layers specifically mentioned, and/or process steps present in addition to the steps specifically mentioned, which have not been specifically shown or discussed herein, but could be included without departing from the scope and spirit of the invention disclosed herein. Similarly, references to structures adjacent, between or other positional references to other structures merely describe the relative positions of the structures, with or without intermediate structures. Also, certain layer or layers disclosed herein may be omitted or replaced by other equivalent or different layer or layers of material. Furthermore, one or more of the layer structures may include a multilayered structure having sub-layers that are made of same or different materials. Layers described as being different layers may comprise the same material. The layer structures shown need not be of a continuous structure (e.g., could be in a matrix or array, where appropriate). The layers need not be of uniform thickness, even though illustrated as having uniform thickness. Further, it is contemplated that to the extent it is consistent with the features, functions and purpose of the present invention disclosed herein, the various layers may be stacked in a different sequence not shown. Other variations may be implemented without departing from the scope and spirit of the present invention.

The disclosure below refers to coating, formation and/or deposition of various layers of materials on various structures. Such coating, formation and/or deposition step may include conventional coating, formation and/or deposition processes that would be suitable for the particular layer of material discussed, which may include well known spin coating, printing, silk-screening, chroming, plating, electroless plating, electroplating, sputtering, mechanical placement, chemical vapor deposition (CVD), and/or other processes for forming thin films. Further, the disclosure below refers to formation of specific structures (e.g., patterned and/or formed from various layers). These structures are obtained using processes that may include conventional processes, which may include photo-lithography, printing, silk-screening, curing, developing, etching (e.g., chemical etching, ion etching, and/or other removing processes), plating, and other processes well known in the art for such types of structures and the material involved. Details of such processes have been omitted, since they are well known to one skill in the art. It is noted that even though the disclosure may, by way of examples and not limitations, refer to specific coating, formation, patterning, deposition or other processes in connection with certain layers or structures, other processes may be substituted without departing from the scope and spirit of the present invention.

Overview of Structural and Process Features

By way of overview, the structural and process features of the post passivation structure are first discussed below, prior to discussions of the embodiments of the specific steps in the related fabrication processes.

In one aspect, the present invention provides a post passivation support structure that comprises a relatively thin support layer (e.g., a polymer layer) above the passivation layer to support the RDLs, and in addition a relatively thick support layer (e.g., a polymer layer) for fine pitch interconnects (e.g., conducting posts) extending from the RDLs and terminating as contact structures at the surface of the thick support layer, for a next level packaging structure. The thick support layer may comprise a single layer or multiple layers of sub-layers. The thick support layer connects with the thin support layer at sections between the RDLs, which together form a thick support structure comprising a thin section and a thick section separated by the RDLs.

The relatively thin support layer above the passivation layer supports the RDL, and the relatively thick support layer above the RDLs supports fine pitch interconnects (e.g., conducting posts) which extend from the RDLs and terminate as contact terminals at the surface of the thick support layer. A further support layer may be provided on the thick support layer, to provide stress relief with respect to further structures deposited thereon. In one embodiment, the thick support layer is formed after the conducting posts have been formed. In another embodiment, the thick support layer is first formed, and the conducting posts are formed in vias formed in the thick support layer. In fabricating the post passivation structure, the process of the present invention provides fine pitch contact structures over the passivation layer of the semiconductor device. The top surface of the thick support layer may be planarized before defining the contact structures. In the alternative, optionally, and/or in addition, an encapsulating layer is provided above the thick support layer, which top surface is planarized before defining the contact structures. The encapsulating layer and the further support layer may be the same layer. More specifically in an illustrated embodiment, the post passivation structure is designed to form fine pitch contact structures over the semiconductor chip by electroplating or electroless plating process over a thick support layer that has been planarized by a polishing process (e.g., chemical mechanical polishing (CMP)).

The support layers each comprises (in a single layer or a stack of layers) a polymeric material, such as polyimides (PI), benzocyclobutene (BCB), epoxy, solder mask, Payralene, Silicone, elastomer (e.g., silicone based), SOG (spin-on-glass, an organic or inorganic material), low k (electrical conductivity) dielectric material suitable for WLP, such as for chip size packaging (CSP). These types of materials are readily applied by spin coating while in their uncured form and they may then be hardened (cured) through reaction with a hardening agent, usually but not necessarily, accelerated by heating. Additionally, the polyimides are available in the form of dry films that can be applied directly to a surface by means of an adhesive. The choice of material depends on a number of factors relating to the layer and adjacent structures, including factors such as temperature coefficient of expansion, degree of elasticity, moisture absorption and permeability properties, adhesion, and electrical properties. For illustration purpose only, and not limitation, the discussions below in connection with the illustrated embodiments will refer to the use of PI as the support layers, including photosensitive and non-photosensitive PI (photosensitive PI does not require an additional mask to form features therein or thereon, non-photosensitive PI does).

Process 1—Embossed Metal Post

Generally, for this process, post passivation, an RDL is deposited over a thin first polymer layer, and metal posts are formed prior to depositing the thick second polymer layer to a height covering the metal posts. The thick second polymer layer is then subject to planarization, such as a CMP process, to expose the top surface of the metal posts. In this process, a photolithography process is applied to a photo-resist layer to define the metal posts, prior to formation of the thick second polymer layer. FIGS. 2 to 12 are schematic sectional views illustrating embodiments of post passivation process steps, in accordance with this aspect of the present invention.

Figure 2:
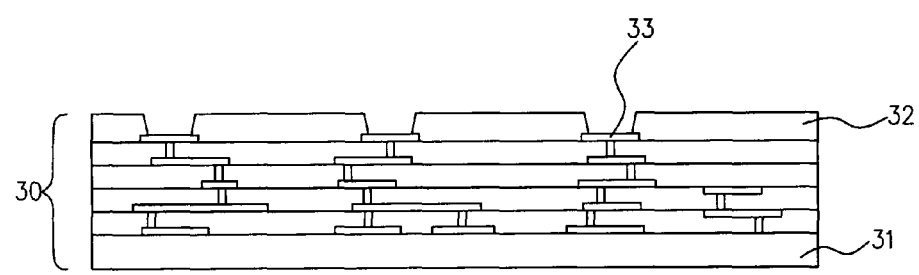
FIG. 2 is a schematic sectional view illustrating a semiconductor device, in accordance with one embodiment of the present invention.

Specifically, FIG. 2 schematically illustrates a multi-layered IC chip 30 having a plurality of semiconductor devices, as represented at a wafer level on wafer substrate 31. The detail internal structure of the IC chip 30 and the process for fabricating same are not relevant to the present invention. The IC chip 30 includes a passivation layer 32 having openings through which chip I/O pads 33 are exposed. The passivation layer 32 is the last layer of the IC chip 30, which provides protection to the underlying circuit structures. Generally, as well known in the art, it has properties such as scratch protection, impermeable to moisture, exhibits loss stress, conformal step coverage, high thickness uniformity, impermeable to sodium atome and other highly mobile impurities and ions, easily patterned, and good adhesion to conductors and dielectric. Suitable materials for the passivation layer 32 include silicon nitride, or a stacked layer of SiN and oxide. The semiconductor devices formed on the wafer substrate 31 may include CMOS, NMOS, PMOS, Bipolar BiCMOS devices. The metal interconnections within the IC chip 30 may be Al, Cu (e.g., Damascene Cu), Al—Cu alloy, etc.

Figure 3:
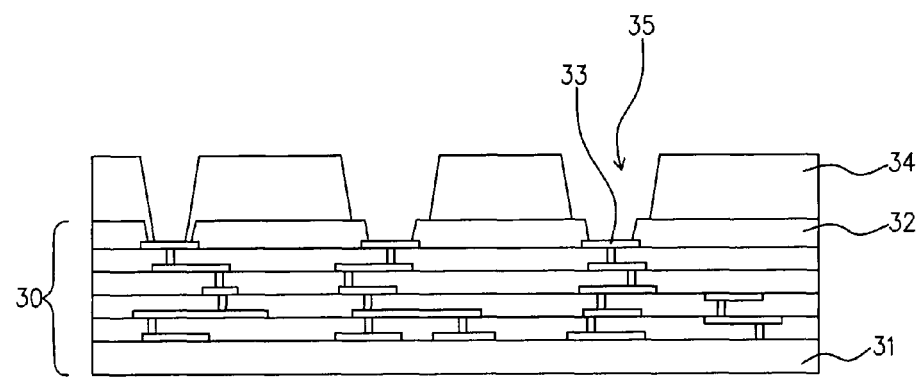
FIGS. 3 to 12 are schematic sectional views illustrating process steps obtaining a post passivation structure, in accordance with one embodiment of the present invention.

In FIG. 3, a relatively thin, first PI layer 34 is deposited on the passivation layer 32, which is patterned with openings 35, aligned with the openings in the passivation layer 32 exposing the chip I/O pads 33. The first PI layer 34 is cured.

Figure 4:
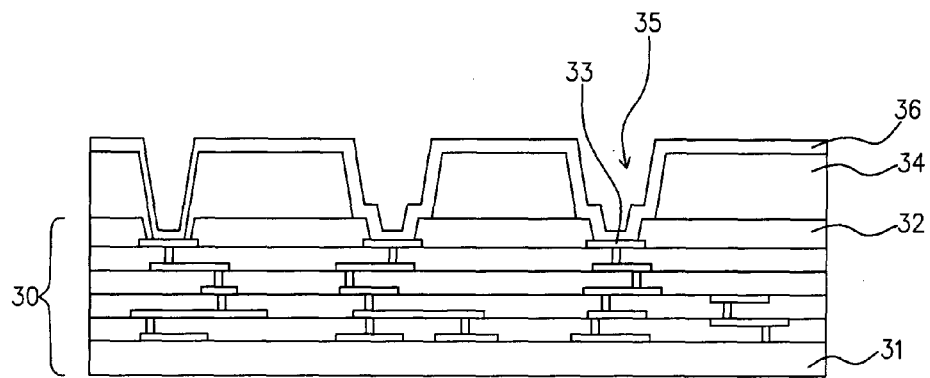
Figure 5:
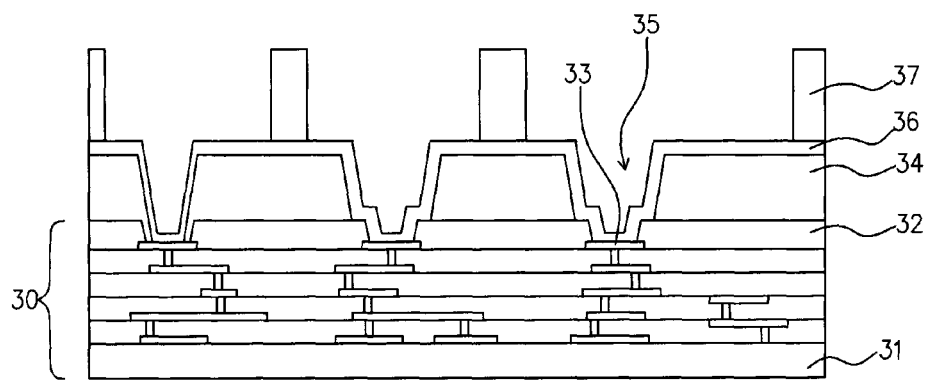
Figure 6:
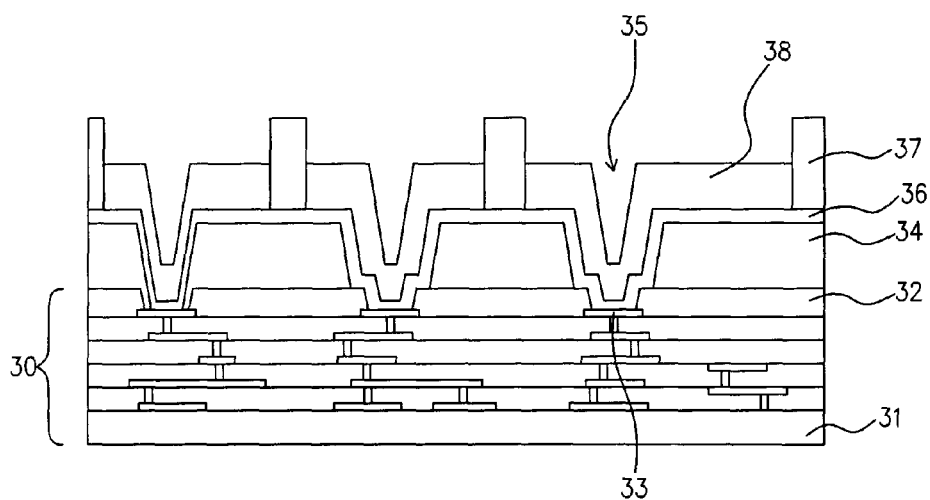

The RDL is formed by the process steps illustrated in FIGS. 4 to 6. In FIG. 4, a primer coating 36 is formed on the first PI layer 34, including step coverage at the opening 35. The primer coating 36 may be an adhesion layer, a barrier layer, or a seed layer, which includes materials such as Cr/Cu, Ti/Cu, and/or TiW/Au. In FIG. 5, a photoresist layer is coated on the primer layer 36, and patterned to produce posts 37 on the primer layer 36. In FIG. 6, a metal layer is patterned and electroplated on the exposed sections of the primer layer 36, forming RDLs 38, each in electrical contact with a chip I/O pad 33. The photoresist posts 37 are subsequently removed, leaving spaces between adjacent RDLs. RDLs may comprise Cu/Ni, Au, or other high electrical conductivity metals or metal alloys. Because the first PI layer 34 is thin, step coverage by the RDL on the first PI layer 34 results in small lateral displacements.

Figure 7:
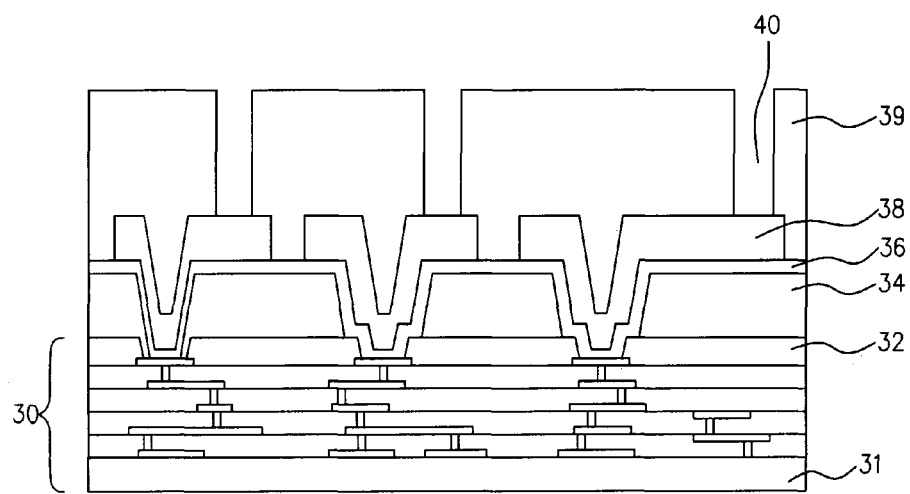
Figure 8:
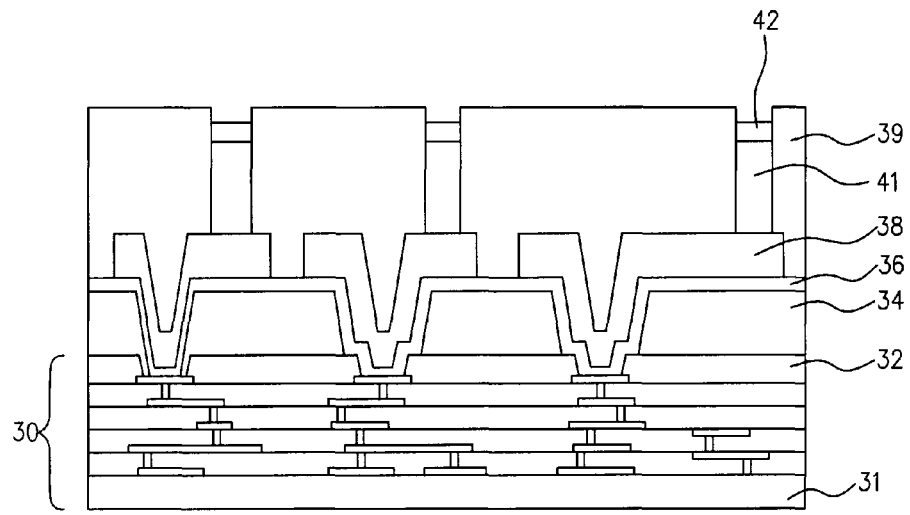
Figure 9:
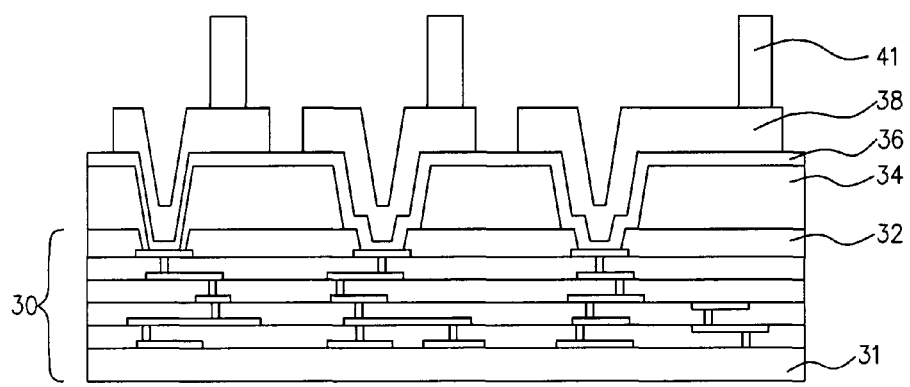
Figure 10:
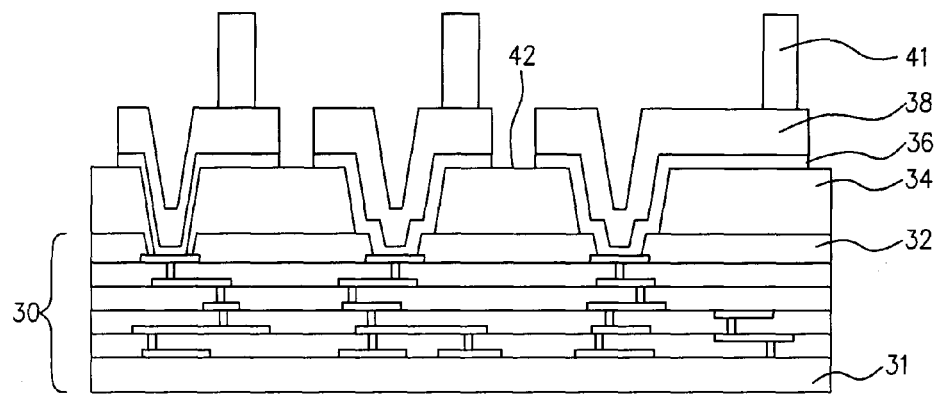

The formation of the metal posts is shown by FIGS. 7 to 9. In FIG. 7, a thick photoresist 39 is coated on the RDLs 38, including the spaces between adjacent RDLs. The photoresist 39 is patterned to form deep holes 40. In FIG. 8, an electroplating process is applied to fill (to a desired height level) the holes 40 with metal (e.g., copper, gold, or other high electrical conductivity metals) to form metal posts 41. The metal posts 41 may have a cross-section that is circular, square, rectangular, or other geometrical shape, having a characteristic width (i.e., the minimum width of the metal post). The metal posts 41 may have the same or different cross-sections. Optionally, another metal may be deposited on top of the metal posts 41 to form contact structures 42, such as solder pads (e.g., Sn, Pb, PbSn, or lead free solder), solder wetting pads (e.g., Au), solder barrier pads (e.g., Ni), UBM, or wire bonding base. FIG. 9 shows the structure after the photoresist 39 has been stripped from the structure of FIG. 8, leaving free-standing metal posts 41 (the optional contact structures 42 are omitted, but the discussions herein below are also applicable to the metal post embodiment in FIG. 8.) Sections of the primer layer 36 exposed by the RDLs are removed, as shown in FIG. 10.

Figure 11:
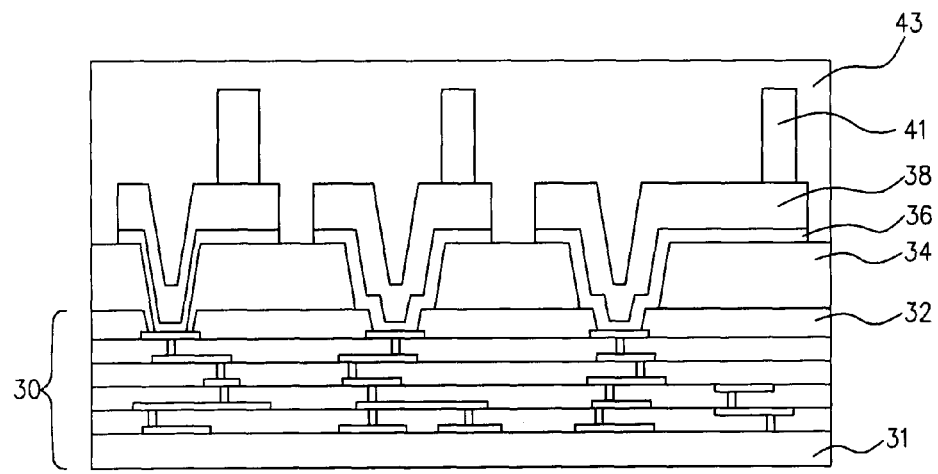

To provide lateral support to the freestanding metal post structure, a second polymer layer is provided next to the metal posts. As shown in FIG. 11, a thick, second PI layer 43 is deposited and cured on the resulted structure shown in FIG. 10, at a thickness after curing which is sufficient to completely cover the metal posts 41. The second PI layer 39 and the first PI layer 34 come into contact at the spaces between adjacent RDLs 38, thereby forming an overall thick PI structure, including a thin section below the RDLs 38 and a thick section above the RDLs.

Figure 12:
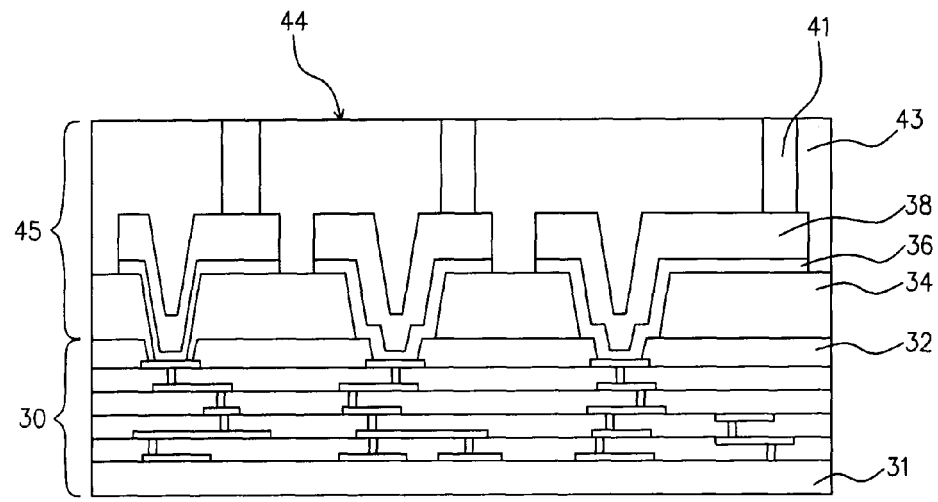

As the morphology of the second PI layer 43 may not be flat and/or smooth due to undulations at the surface as a resulting of the curing process, a planarization process is performed on the cured second PI layer 43. In FIG. 12, the second PI layer 43 is planarized (e.g., by chemical mechanical polishing (CMP)) to a level exposing the ends of the metal posts 41 (which may also be planarized in the process), forming an overall planarized surface 44. If the optional contact structures 42 were present, the planarization step would expose the contact structures 42.

The resultant structure 46 shown in FIG. 12 forms the basic post passivation structure in accordance with one aspect of the present invention. This post passivation structure 45 is the foundation to allow formation of close-pitch contact structures for a next level packaging structure. The exposed ends of the metal posts are the sites for contact to conductive structures, such as for attaching solder balls or attachment to other features, as further disclosed below.

Figure 13:
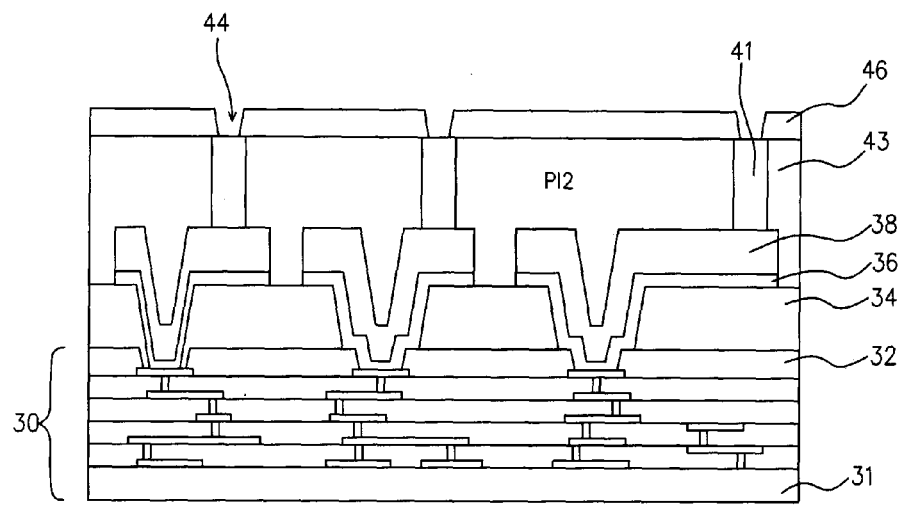
FIGS. 13 and 14 are schematic sectional views illustrating optional preparation of the post passivation structure for further bonding options.
Figure 14:
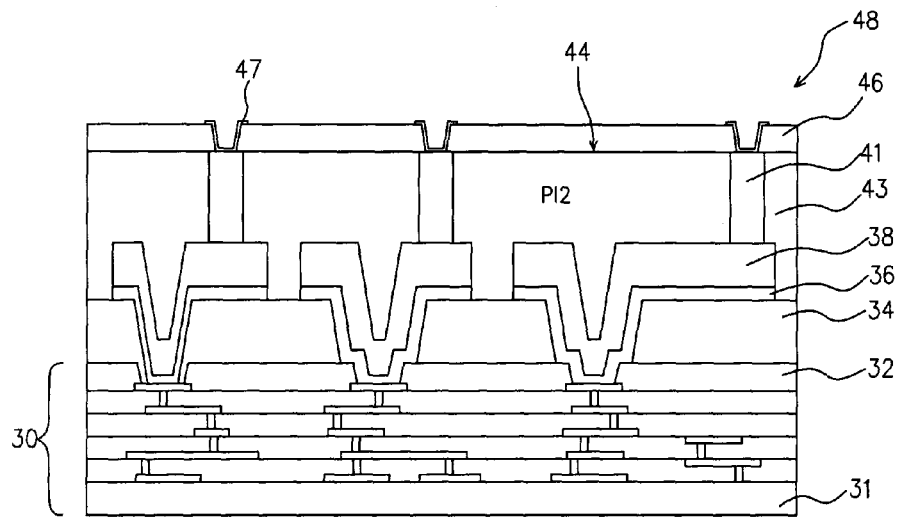

FIGS. 13 and 14 show that additional or optional contact structures that may be formed on top of the planarized surface 44 of the post passivation structure in FIG. 12, to prepare the post passivation structure 45 for various bonding options. FIG. 13 shows the forming of a third PI layer 46 on the planarized surface 44 of the post passivation structure 45. The third PI layer 46 is patterned with openings to expose the top ends of the metal posts 46. The top surface of the third PI layer 46 may be planarized prior to patterning the openings. A UBM 47 (comprising a barrier layer of TiW/Au) is formed in each opening of the third PI layer 46, as shown in FIG. 14.

It is noted that because the third PI layer 46 is formed on a planarized surface 44, the features of the third PI layer 46 (including the openings exposing the top end of the metal posts 41, and subsequent formation of the UBMs 47) may be defined very precisely, with high tolerance and high resolution, to result in a close pitch contact structure, using electroplating and associate photolithography processes. The planarized surface 44 provides a smooth foundation for a more uniform layer of photoresist layer that is required in photolithography. The features obtained by photolithography would have finer structures, at higher tolerance and higher resolution. Further, in view of the thin first PI layer 34, the step coverage of the RDL 37 on the first PI layer 34 does not result in large lateral displacements. Accordingly, with an increase in number and density of semiconductor devices in the IC chip, and as a result closer IC I/O pads, there are still sufficient lengths of RDLs 38 available for placement of the metal posts 41 on the RDLs 38.

There are various interconnections, contact structures and bonding options made possible by the resultant post passivation structure 48 shown in FIG. 14, as exemplified in FIGS. 15-19. These structures can be formed with close dimensional tolerance on the underlying planarized post passivation structure 48.

Figure 15:
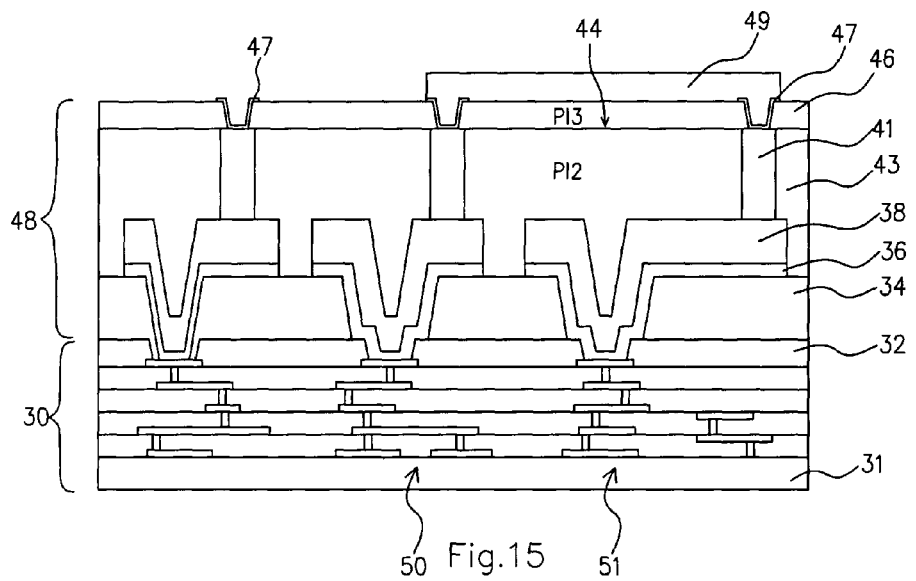
FIGS. 15 to 21 are schematic sectional views illustrating various bonding options, in accordance with further embodiments of the present invention.

FIG. 15 illustrates a high-bandwidth conductor 49 formed on the post passivation structure 48, which interconnects two semiconductor devices 50 and 5 in the IC chip 30. The conductor 49 (e.g., Cu/Ni, Au) may be significantly wider and/or thicker compared to the interconnections within the IC chip 30. The basic "freeway" concept has been patented (e.g., U.S. Pat. No. 6,495,442), which is now further improved with the post passivation structural foundation of the present invention. In accordance with the present invention, this post passivation interconnection provides an efficient, low loss, high speed, high bandwidth interconnection between the two semiconductor devices 50 and 51, at an elevated structural level that does not take up valuable space within the IC chip 30, with reduced electrical and/or magnetic interferences, and in a stress buffered structure.

Figure 16:
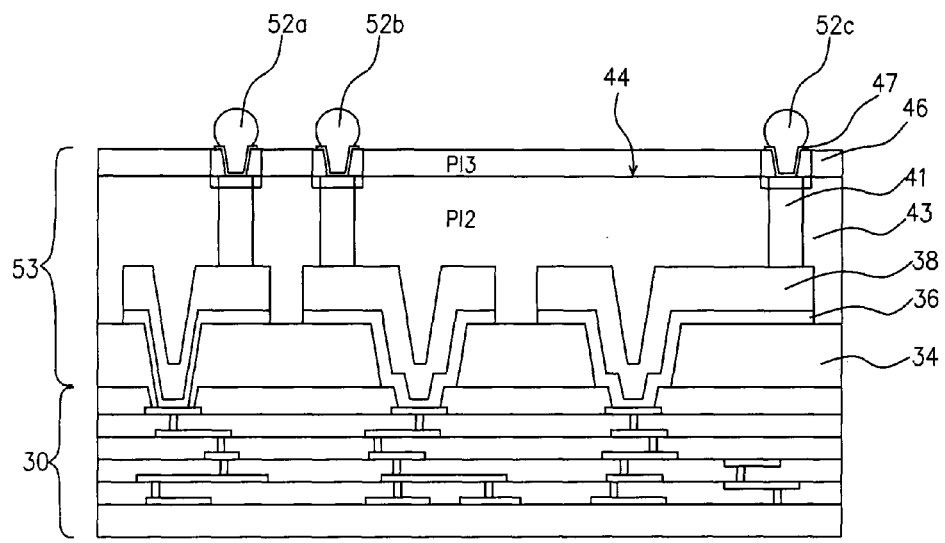

FIG. 16 shows the deposition of solder bumps or solder balls 52 on the UBMs 47 of a fine pitch post passivation structure 53 that is similar to the post passivation structure 48 discussed above. Here, FIG. 16 shows more clearly that the solder balls 52a and 52b can be positioned at fine pitch (i.e., center spacing between the adjacent solder balls). The solder balls 52 may be positioned on the UBMs 47 by electroplating, or by known mechanical placement processes. It is noted that the pitch achievable by mechanical placement of the solder balls is more limited by the resolution and tolerance associated with robotic solder ball placement processes, as compared to photolithography and electroplating processes. However, such limitations may be offset to some extent by the fine pitch metal posts.

Figure 17:
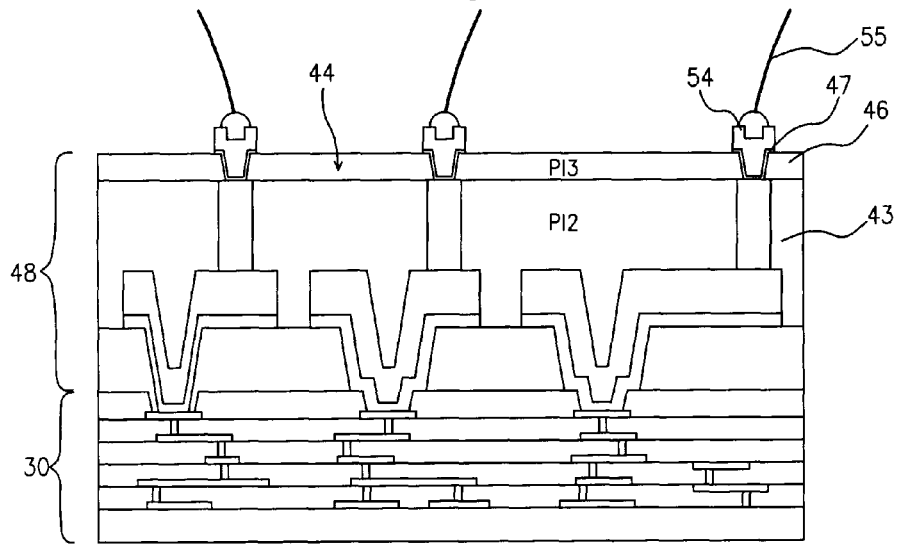
Figure 18:
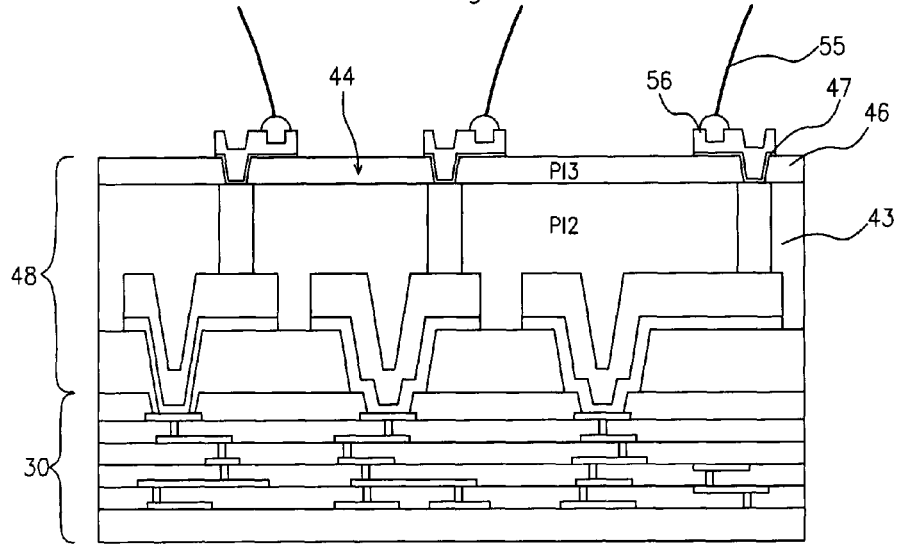

FIGS. 17 and 18 illustrate two alternate wire-bonding options. In FIG. 17, bumps 54 are formed on the UBMs 47 by an electroplating process. Au wires are bonded to the bumps 54. In FIG. 18, bonding pads 56 are formed on the UBMs 47 by an electroplating process. The bonding pads 56 are redistribution layers above the metal posts, supporting wirebonding in an offset position with respect to the metal posts, but the bumps 54 support wirebonding directly above the metal posts. As noted above, the planarized surface 44 on the post passivation structure enables high resolution electroplating using photolithographic methods, thus resulting fine pitch contact structures that are not possible using prior art post passivation processes.

Figure 19:
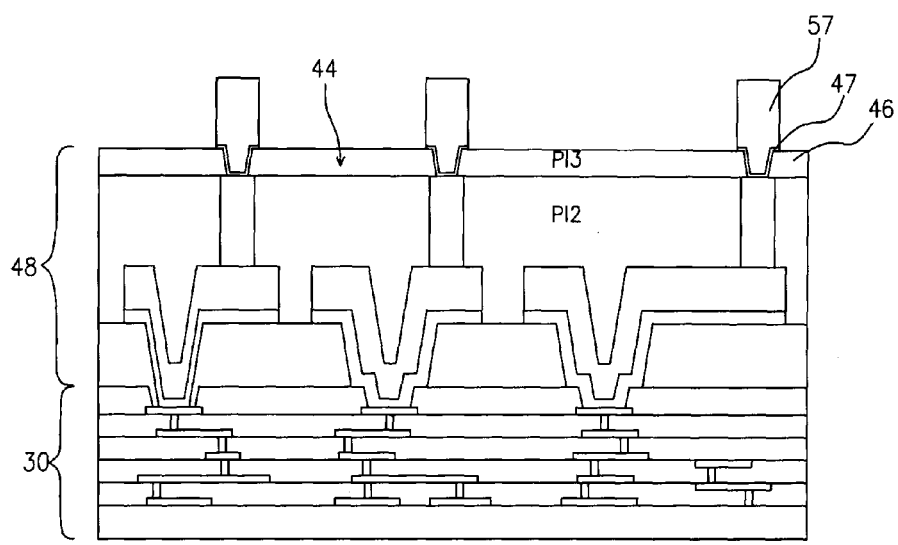

FIG. 19 shows the option of depositing Au bumps 57 on a fine pitch post passivation structure 48, using placement techniques.

Figure 20:
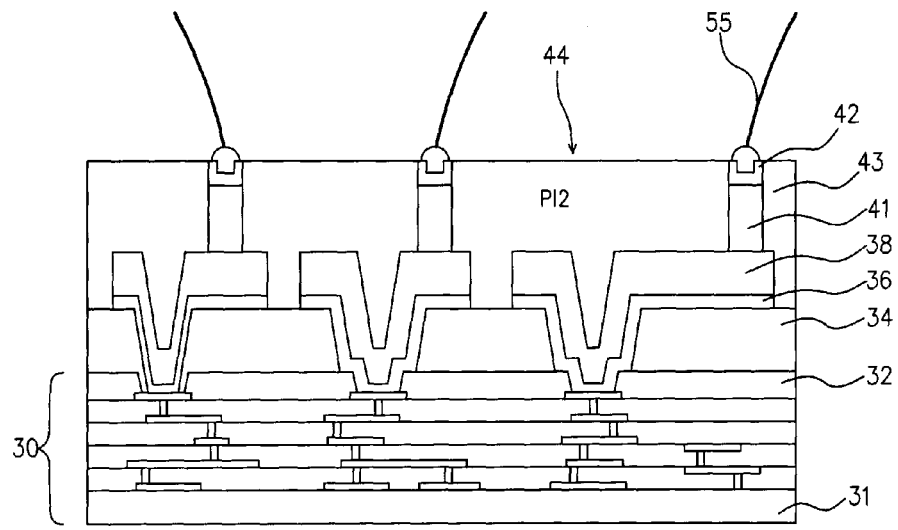
Figure 21:
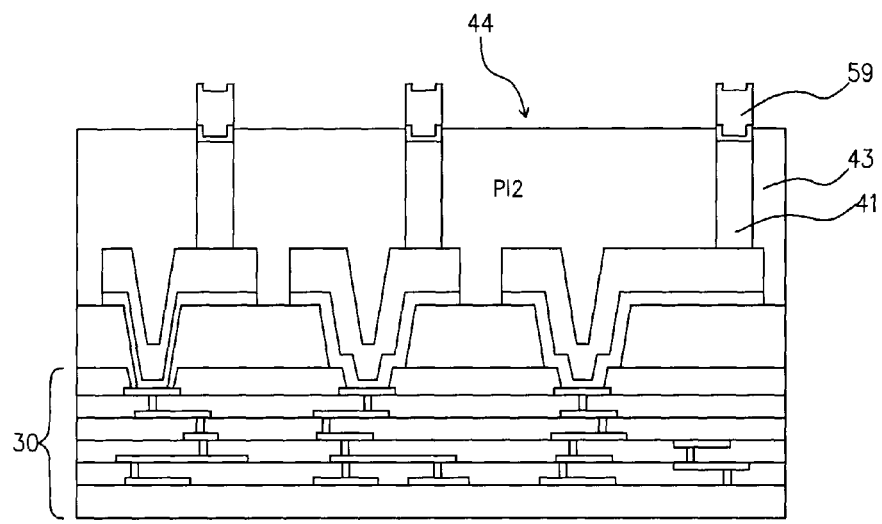

FIG. 20 illustrates an alternate bonding option, based on the structure obtained by the alternative process described in connection with FIG. 8 above. The metal posts 41 are capped with contact structures 42. After subjecting the capped metal posts 41 through the rest of the steps similar to those discussed in connection with FIGS. 9-12, wires 55 are bonded directly to the contact structures 42 at the top ends of the metal posts 41, after the second PI layer 43 has been planarized with respect to the contact structures 42. Alternatively, the structure illustrated in FIG. 20 may be obtained by etching the top end of the planarized structure 55 shown in FIG. 12, to define wells in the second PI layer 43. Metal pads (Ni/Au) similar to contact structures 42 may be deposited on the metal posts 41 by electroplating, in a fine pitch structure made possible by the planarized surface 44 on the second PI layer 43. FIG. 21 illustrates a variation of this embodiment, by depositing Au bumps 59 into such etched wells in the planarized surface 44 of the second PI layer 43, using placement techniques.

Figure 22:
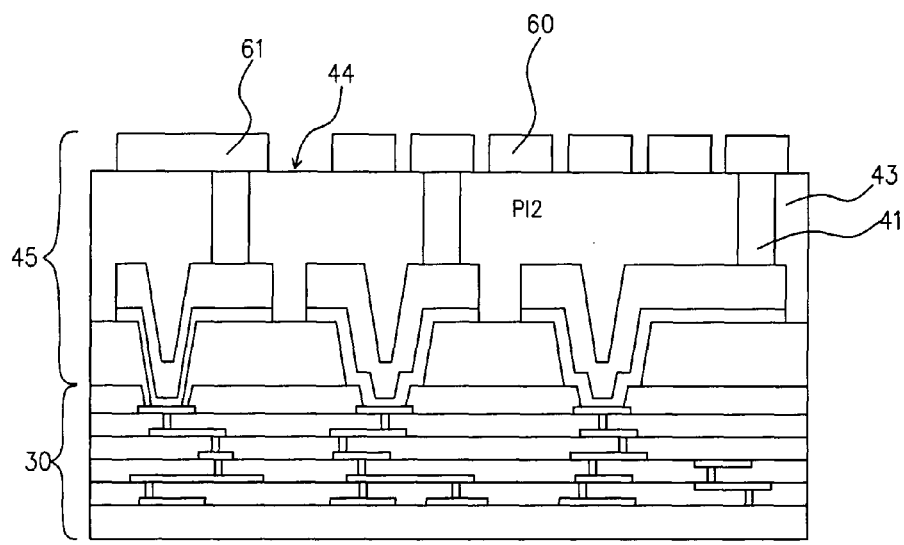
FIG. 22 is a schematic sectional view illustrating an inductor structure above the inventive post passivation structure, in accordance with one embodiment of the present invention.

Other than providing a contact structure on the planarized surface 44 of the post passivation structure 45 shown in FIG. 12, active or passive circuit elements may be provided. For example, waveguide, resistive, capacitive and/or inductive elements may be provided. FIG. 22 illustrates an embodiment in which inductors 60 and capacitor 61 are provided on the planarized surface 44, some of which are in contact with the metal posts 41. These elements are schematically represented in FIG. 22, which may have a multiplayer structure the details of which are not shown. Again, because of the planarized surface 44, precise and/or fine pitch structures having high tolerance and high resolution may be formed for the capacitors and inductors, using photolithographic processes, for example.

While the foregoing embodiments each represent a particular type of contact structure or element in the post passivation structure, it is contemplated that a mix of contact structures and elements may be found in the post passivation structure. Further, the contact structures and elements may be stacked in multiple layers above the planarized surface 44. Further, the structures and elements may be encapsulated by a protective layer, to form the finishing surface of the wafer level processed package.

From the foregoing embodiments, it can be seen that the thin first PI layer 34 and the thick second PI layer 43 in the spaces between adjacent the RDLs 38. Therefore, the first PI layer 34 and the second PI layer 43 together form a thick PI structure that comprises a thin PI sub-layer below the RDL and a thick PI sub-layer above the RDL. This overall thick PI structure improves stress-buffering. More specifically, the thin first PI layer 34 provides a thin step coverage for the RDL 38, which results in less lateral displacement of the RDL. The overall thick PI structure, including the thick second PI layer 43 and the thin first PI layer 34, provides an improved stress relief or buffer structure. In view of the two polymer sub-layers, both the step coverage and stress buffering functions can be optimized, without having to compromise between the two functions by relying on a single thick layer to both support RDL and provide stress buffering, or separate polymer layers that would not optimize stress buffering. In accordance with the present invention, the two polymer sub-layers within the overall thick polymer structure essentially compensate the shortcoming of one another, so that the advantages of both layers can be fully realized. The less stress buffering of the thin polymer sub-layer is compensated by the high stress buffering of the thick polymer sub-layer. Without limiting the total thickness of the polymer to only one polymer layer, otherwise poor step coverage and large RDL displacements associated with a single thick polymer layer can be avoided, it is possible to improve stress buffering without comprising RDL displacements, by strategically using a thin polymer sub-layer in an overall thick polymer structure to support the RDL, and the additional thick polymer sub-layer to improve stress-buffering. This makes its stress buffering capability much higher than that of the conventional art that uses a single layer of polymer material for both stress buffering and RDL, where stress buffering capability is offset by other issues such as the large lateral RDL displacement, or lateral RDL displacement control capability is offset by poor stress buffering. The combination of the first PI layer 34 and the second PI layer 39, along with the planarized surface 44, provides a foundation for fine pitch contact structure and elements, including ball formation, pad formation, bonding structures, active and passive elements, etc., as illustrated by the various embodiments.

In accordance with one embodiment of the present invention, the relative characteristic physical dimensions of various structures post passivation may be on the order of:

overall size of chip (as measured by overall boundary of semiconductive devices in chip): <5 mm×5 mm number of conductive posts (i.e., pin count): >400 per 5 mm square thickness of passivation layer: 0.2-5 µm (e.g., 1.2 µm)

thickness of thin support layer above passivation layer: 0.5-10 µm thickness of RDL: 1-30 µm thickness of thick support layer above RDL: 50-300 µm characteristic width (e.g., minimum diameter or lateral length of a side) of conductive post: <250 µm height of conductive post: 25-200 µm (e.g., 100 µm)

pitch: <250 µm (e.g., contact structure pitch <250 µm, or conductive post pitch <250 µm, or solder ball pitch <250 µm and solder ball diameter <250 µm), such as 200 µm, 150 µm, 100 µm, etc.

resolution: 5-10 µm (to ensure adequate separation of the solder balls to prevent shorting)

tolerance: + or −20% of process variation

Process 2—Damascene Metal Post

This process of the present invention involves some steps that are quite similar to the Process 1 discussed above, but with a different sequence of steps, namely, the metal posts are formed in a polymer layer instead of encapsulating free-standing metal posts. This process presents similar advantages (i.e., stress buffering without excessive lateral displacements of RDLs) and additional advantages (finer pitch) over the Process 1 discussed above. Generally, for this process, post passivation, an RDL is deposited over a thin first polymer layer, and a thick second polymer layer metal posts is formed on the RDL and the thin first polymer layer, prior to forming and filling openings in the second polymer layer with metal to form metal posts. The openings may be filled by a damascene process (e.g., sputtering adhesion/seed layer, electroplating) to form the metal posts. The thick second polymer layer is then subject to planarization, such as a CMP process, to the level of the top surface of the metal posts. The embedded metal posts in the polymer body (with the top surface of metal posts exposed) connect the RDL to a next level packaging structure, which may include a contact structure (e.g., bonding structures such as wire bonding pads, UBM, solder bumps, Au bumps), interconnections and transmission lines, and active and passive elements (e.g., waveguides, inductors, resistors, capacitors), all can be formed over the IC chip with fine dimensional tolerance and with little sacrifice on valuable space within the IC chip.

It is noted that because the metal posts are formed by filling holes in the thick second polymer layer with metal, instead of encapsulating free-standing metal posts with a polymer material, the metal posts can be positioned with better tolerance and resolution, to achieve a fine pitch structure (i.e., center spacing between adjacent metal posts). If free-standing metal posts are encapsulated using the process described in U.S. Pat. No. 6,103,552, the free-standing metal posts may be bent or disturbed by the encapsulating layer, thus resulting in lower tolerance and/or resolution in the metal post positions, to prevent obtaining a fine pitch structure. With fine pitch metal posts in accordance with the present invention, it can offset to some extent the mechanical limitations associated with mechanical placement techniques used for subsequent formation of contact structures (e.g., solder ball placements and gold bump placements).

The post passivation structure in accordance with the Process 2 is capable of forming an "extraordinarily" fine pitch metal post and RDL over the IC chip. FIGS. 23 to 28 are schematic sectional views illustrating some embodiments of the post passivation process steps, in accordance with this aspect of the present invention. It is noted that similar steps that are present in Process 1 have been omitted in the discussion below, to avoid unnecessarily obscuring the inventive aspects.

Figure 23:
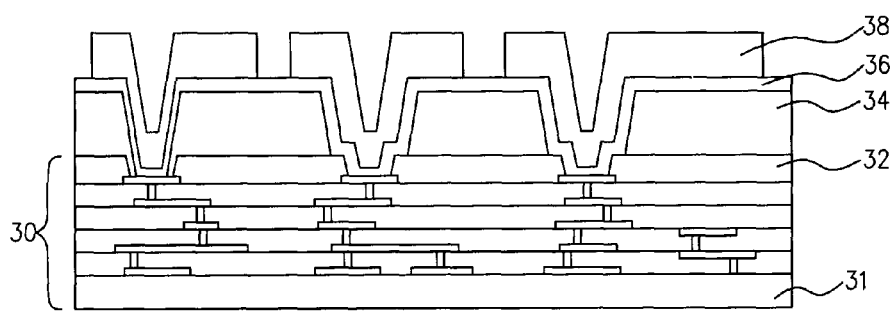
FIGS. 23 to 28 are schematic sectional views illustrating post passivation process steps, in accordance with another embodiment of the present invention.
Figure 24:
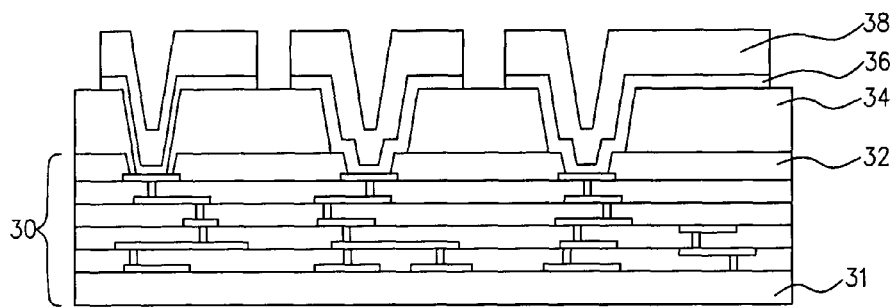

Referring to FIG. 23, after the RDLs 38 are formed in FIG. 6, the photoresist posts 37 are removed. Sections of the primer layer 36 (e.g., barrier/seed layer) exposed by the RDLs 38 are removed, as shown in FIG. 24. Comparing to Process 1, the primer layer 36 is maintained after formation of the RDLs, until after the freestanding metal posts 41 have been formed.

Figure 25:
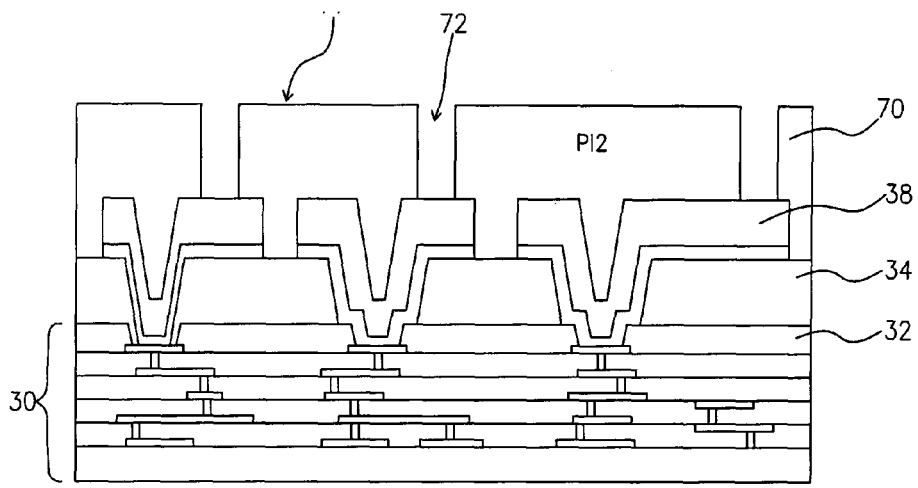

In FIG. 25, a thick second PI layer is formed, covering the RDLs 38 and the exposed first PI layer 70, thereby connecting with the to the PI layer 34 to form an overall thick PI structure. The PI layer 70 may comprise a photosensitive polyimide (i.e., PSPI) material, which may be the same material as the PI layer 34. To form a thick layer of PI, one approach is to deposit multiple thin layers of PI to buildup the desired thickness. The PI layer 70 is patterned to form a plurality of openings 72. Patterning may be done as each thin layer is formed, or after the overall PI layer 70 has been completed. The second PI layer 70 is cured, and its top surface 71 may be planarized at this point (which is optional but preferred depending on the desired resolution and pitch to be ultimately achieved).

Figure 26:
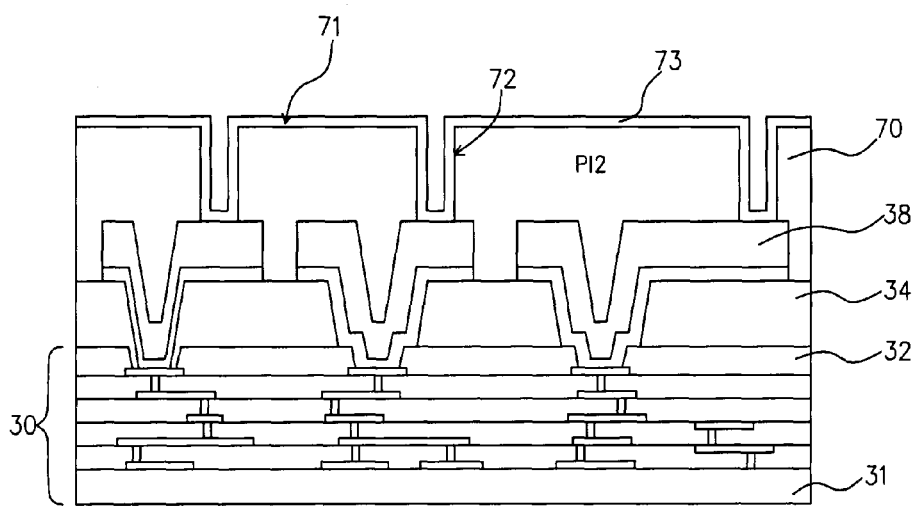
Figure 27:
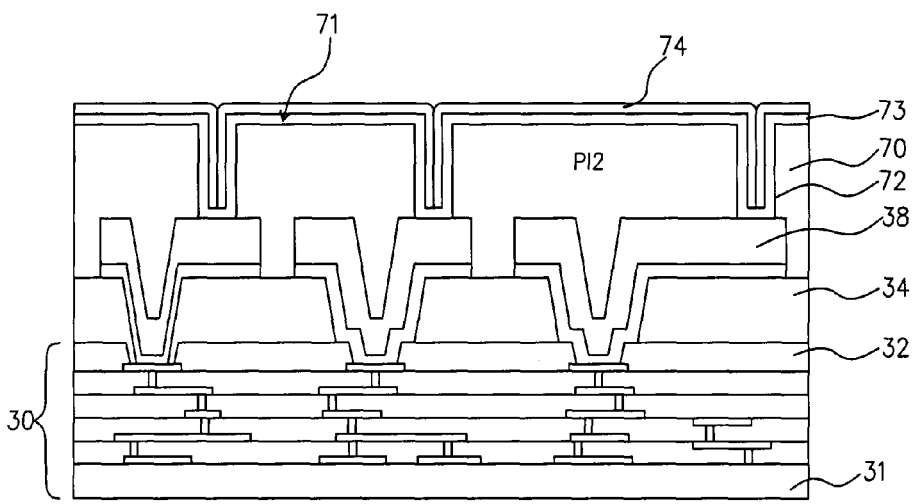

In FIG. 26, a primer layer (e.g., a barrier/seed layer) is formed in the openings 72 by depositing a blanket film to cover the whole wafer, including both the inner walls of the openings 72 as well as the top surface 71 of the second PI layer 70 polymer outside the openings 72. Various deposition processes such as sputtering, ALD, CVD, and electroless plating may be used. Further referring to FIG. 27, the coasted openings are filled with metal 74 (e.g., copper, gold, or other metals) using an electroplating process, which can be carefully manipulated to achieve an anisotropic deposition.

More particularly, the deposition rate on the vertical walls of the openings 72 and horizontal surfaces are controlled to be different seamlessly, wherein the walls of the openings 72 are primarily coated, but with an abated amount of deposition on the surface of the PI layer 70. The electrolyte used for anisotropic plating process (typical for trench filing) contains suppressor and accelerator. The suppressors are mostly large molecular weight molecules that tend to settle onto horizontal surfaces, including at the bottom of the openings 72, as sediments. These sediments do not attach to the barrier/seed layer 73 firmly. Instead, they form a sludge-like layer on the horizontal surfaces, which resists further deposition of metal from the electrolyte onto the surface of barrier/seed layer 73. Thus, in the presence of the suppressor, the deposition rate on the horizontal surface is abated. However, the deposition rate at the vertical surfaces is not affected much by the suppressor, since sediments do not settle on or otherwise attach to the vertical surfaces.

Accelerator is often made of short-length molecules that include strongly polarized bonds (i.e., hydrogen bonds). When present in the electrolyte, one end of the molecule (or ion) adheres by Van de Waal forces to the barrier/seed layer 73, thereby aligning the molecules along the vertical walls of the openings 72. When an abundant amount of accelerator is attached to a vertical wall, the deposition rate is enhanced in that the flow of ions in the electrolyte is regulated.

Figure 28:
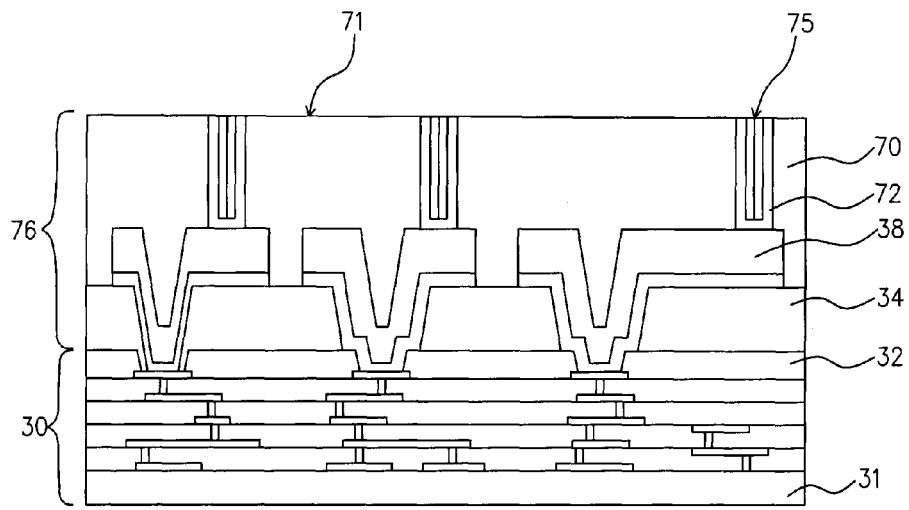

The structure is then subject to planarization (e.g., a CMP process) to remove the metal deposited at the top horizontal surface outside the opening 72, as shown in FIG. 28. Upon completion of the CMP process, the barrier/seed layer at the top of the structure would be removed completely, to expose the top surface 71 of the second PI layer 70. The remaining metal structure in each opening 72 forms a metal post 75, which comprises a composite damascene structure. The result is a post passivation structure 76 as shown.

On top of the planarized surface 71 of post passivation structure 76, further structures may be formed, such as contact structures, active or passive elements, interconnections, or connections to next level packaging structures. For example, Ni, solder, Au pad, Au bump, wire-bonding pad, inductor, resistor, capacitor, interconnections, etc., may be deposited to connect to the metal posts 75, similar to the embodiments discussed above in relation to the Process 1 (see, FIGS. 13-22), which steps will not be repeated herein. As in the earlier embodiments, the contact structures formed over the metal posts 75 allow the metal posts to be bonded to next level packaging structures firmly. As in the earlier embodiments, a third PI layer may be provided on the planarized surface 71 of the post passivation structure, similar to FIGS. 13 and 14.

The Process 2 produces a post passivation structure that possess an extraordinarily fine pitch metal post structure over the RDL. This is attributed in part to the planarization of the polymer layer, for reasons explained earlier in connection with Process 1. Further, because of use of photoresist PI for the second polymer layer 70, when the second polymer layer 70 is deposited over the RDL, the morphology of the first polymer layer 34 will be smoothed out due to the intrinsic viscous-elastic behavior of the polymer. This effect is especially prominent when the second polymer layer is very thick. Thus, the impact of the first polymer layer's morphology on the resolution of the fine pitch structures can be reduced. The embodiments described in connection with Process 1 cannot do this easily because a very thick layer of photoresist polyimide is very costly, and may give rise to resolution and process control that may not be as easily accomplished. If photoresist PI is used in Process 1 for the second polymer layer, the same effect may be achieved.

If the second polymer layer further receives a CMP process prior to the photolithographic process, its surface will be even flatter and smoother. In this case, an extraordinarily fine pitch structure can be formed over the IC chip.

Chip Carrier Level Packaging Structure

As noted before, the WLP-processed post passivation structures discussed above are particularly suited for next level packaging (e.g., chip carrier packaging) based on a fine pitch connection to such post passivation structures. Below is a discussion of an embodiment of a next level packaging structure for the post passivation structures discussed above. Specifically, by way of example and not limitation, a BGA carrier packaging structure is described.

Figure 29:
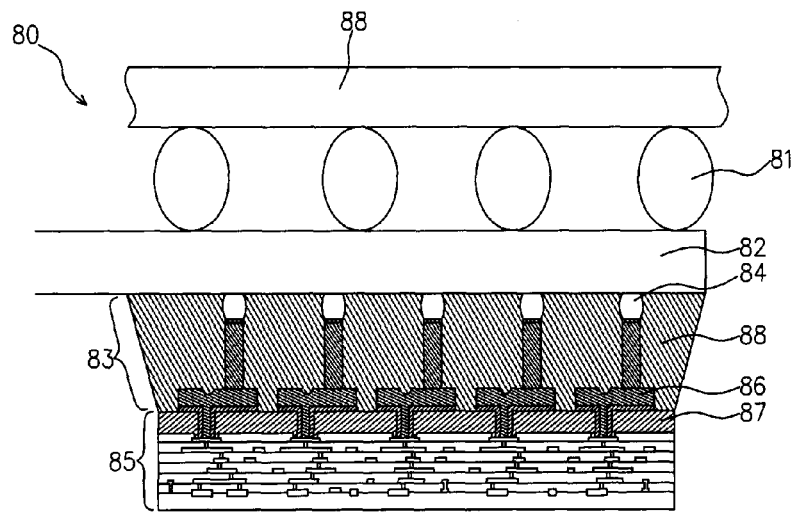
FIG. 29 is a schematic sectional view illustrating bonding of a prior art post passivation structure to a BGA carrier substrate.

BGA carrier packages are well known in the art. Referring to FIG. 29, a conventional BGA carrier package 80 has an array of solder balls 81 on one side of a carrier substrate 82. A conventional post passivation structure 83 of an IC chip 85 is attached to the other side of the substrate 82 via solder balls 84. The conventional post passivation structure 83 includes RDLs 87 connected to I/O pads of the IC chip 85, metal posts 86, and an underfill 88 around the metal posts 86.

The solder balls at the respective sides of the carrier substrate 82 have different dimensions and centerline pitches. Specifically, the array of solder balls 81 is designed for bonding directly to a printed circuit board (PCB) 88. They are deposited on the substrate 82 in a coarse pitch manner such that bonding with the PCB can be performed relative easily (i.e., no need for high resolution or high tolerance). The solder balls 84, which connect the post passivation structure 83 of the IC chip 85 to the carrier substrate 82, are formed in a pitch corresponding to the pitch of the metal posts 86 associated with the IC chip 85. In this conventional post passivation structure 83 that uses an underfill, the top surface of the post passivation structure 83 has not been planarized, and the metal posts 86 and the solder balls 84 are not fine pitch structures. Any minor undulation on the height of the metal posts 86 could induce reliability problems on the bonding to the substrate 82, making the metal posts 86 subject to potential breakage or detachment in the subsequent processes.

Figure 30:
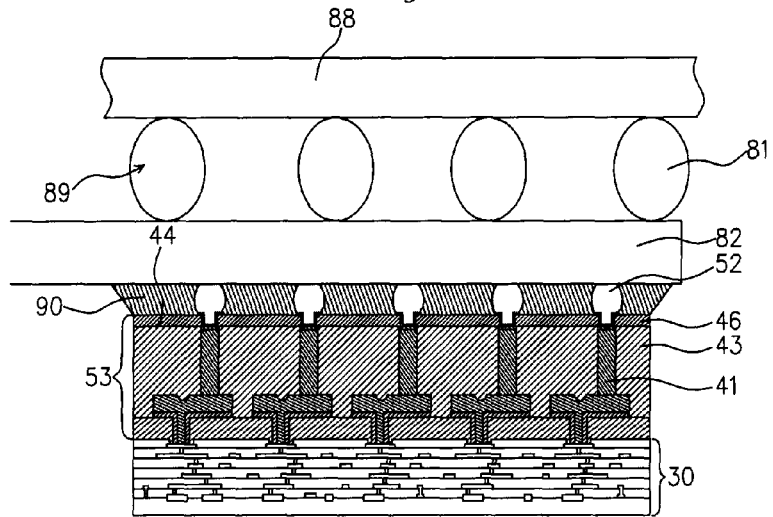
FIGS. 30 to 31 are schematic sectional views illustrating bonding of the inventive post passivation structures to a BGA carrier substrate, in accordance with another aspect of the present invention.

The post passivation structure provides a foundation for firm fine pitch connection to a next level packaging structure, such as a chip carrier, as well as improved stress buffering. Referring to FIG. 30, the IC chip 30 having the post passivation structure 53 in FIG. 16 is bonded to the carrier substrate 82 using fine pitch solder balls 52 (e.g., by an electroplating process involving photolithography), to form a BGA package 89, which may be bonded to a PCB using coarse pitch solder balls 81. An underfill layer seals the space between the carrier substrate 82 and the third PI layer 46. To achieve a firm bonding of the fine pitch solder balls 52 to the substrate 82, a planarized encapsulation layer would improve such bonding. As noted in connection with the post passivation structure 53 in FIG. 16, the third PI layer 46 is formed on the planarized top surface 44 of the second PI layer 43, which benefits include forming fine pitch bonding structures for next level packaging, such as using high resolution, high tolerance photolithographic processes, without the pitch limitations of solder ball placement processes.

It is noted that the third PI layer 46 functions as an encapsulation layer. For encapsulation purpose, other suitable materials may be used, to protect the entire post passivation structure 53 on the IC chip 30. From a package assembly perspective, in which the concern is focused more on the bonding of the fine pitch solder balls 52 to the carrier substrate 82, the layer 46 may be referred to as an encapsulation layer, independent of whether it comprises a polymer material. However, from a chip manufacturing (involving wafer level packaging such as chip size packaging), the concern is focused more on stress induced failure due to differences in coefficient of thermal expansion (e.g., breakage of the delicate IC circuitry), the layer 46 is referred to as a further stress-buffering layer. Therefore, the layer 46 may serve both a stress-buffering function as well as an encapsulation function, in the final carrier package 89.

Figure 31:
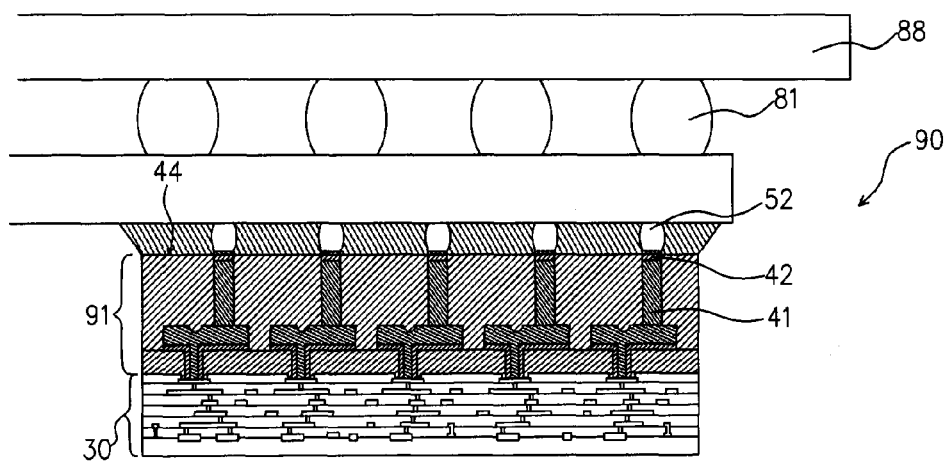

FIG. 31 shows another embodiment of a BGA carrier package 90, in which the post passivation structure 91 resembles the structure discussed in connection with and depicted in FIG. 8, in which metal posts 41 are capped with contact structures 42 formed by electroplating, or an etch back process, similar to the process discussed in connection with FIG. 20 (except that in this case, wires are not bonded to the contact structures 42). As in the previous embodiment of FIG. 30, the top surface 44 of the post passivation structure 91 has been planarized prior to deposition of the fine pitch solder balls 84 (e.g., by an electroplating process involving photolithography). Accordingly, this embodiment also fully takes advantage of the benefits of the earlier embodiments discussed above. As in the prior embodiment, the solder ball space between the planarized surface 44 and the substrate 82 is underfilled.

While the invention has been particularly shown and described with reference to the preferred embodiments, it will be understood by those skilled in the art that various changes in form and detail may be made without departing from the spirit, scope, and teaching of the invention. For example, while the post passivation structure is illustrated to include polymer layers of the same type (i.e., PI), the various polymer layer may comprise different materials. Furthermore, the present invention may be implemented in other than WLP, without departing from the scope and spirit of the present invention. Accordingly, the disclosed invention is to be considered merely as illustrative and limited in scope only as specified in the appended claims.

What is claimed is:

1. An integrated circuit chip comprising:
   a substrate;
   a MOS device on said substrate;
   a first contact pad over said substrate;
   a second contact pad over said substrate;
   a passivation layer over said substrate, wherein a first opening in said passivation layer is over a first contact point of said first contact pad, and said first contact point is at a bottom of said first opening, and wherein a second opening in said passivation layer is over a second contact point of said second contact pad, and said second contact point is at a bottom of said second opening, wherein said passivation layer comprises a nitride;
   a patterned circuit layer over said passivation layer and on said first and second contact points, wherein said patterned circuit layer is connected to said first contact point through said first opening, and said patterned circuit layer is connected to said second contact point through said second opening, wherein said patterned circuit layer comprises a bottom metal layer over said passivation layer and on said first and second contact points, and electroplated copper directly over and in physical contact with said bottom metal layer;
   a first metal post on and in physical contact with said patterned circuit layer, wherein said first metal post is connected to said first contact point through said patterned circuit layer, wherein said first metal post is not vertically over said first contact point, wherein said first metal post comprises electroplated copper and has a height between 25 and 200 micrometers;
   a second metal post on and in physical contact with said patterned circuit layer, wherein said second metal post is connected to said second contact point through said patterned circuit layer, wherein said second metal post is not vertically over said second contact point, wherein said second metal post comprises electroplated copper and has a height between 25 and 200 micrometers, wherein a pitch between said first and second metal posts is less than 250 micrometers;
   a first polymer layer over said passivation layer and on said patterned circuit layer, wherein said first metal post is in said first polymer layer and has a top surface not covered by said first polymer layer, and wherein said second metal post is in said first polymer layer and has a top surface not covered by said first polymer layer, wherein said top surface of said first metal post and said top surface of said second metal post are substantially coplanar with a top surface of said first polymer layer;
   a UBM layer on said top surface of said first metal post and said top surface of said second metal post;
   a first electroplated solder bump on said UBM layer and vertically over said top surface of said first metal post; and
   a second electroplated solder bump on said UBM layer and vertically over said top surface of said second metal post.

2. The integrated circuit chip of claim 1, wherein said UBM layer comprises titanium.

3. The integrated circuit chip of claim 1 further comprising a second polymer layer on said passivation layer, wherein said patterned circuit layer and said first polymer layer are further on said second polymer layer.

4. The integrated circuit chip of claim 1, wherein said bottom metal layer comprises titanium.

5. The integrated circuit chip of claim 1, wherein said bottom metal layer comprises copper.

6. An integrated circuit chip comprising:
a substrate;
a MOS device on said substrate;
a first contact pad over said substrate;
a second contact pad over said substrate;
a separating layer over said substrate, wherein a first opening in said separating layer is over a first contact point of said first contact pad, and said first contact point is at a bottom of said first opening, and wherein a second opening in said separating layer is over a second contact point of said second contact pad, and said second contact point is at a bottom of said second opening, wherein said separating layer comprises a nitride;
a patterned circuit layer over said separating layer and on said first and second contact points, wherein said patterned circuit layer is connected to said first contact point through said first opening, and said patterned circuit layer is connected to said second contact point through said second opening, wherein said patterned circuit layer comprises a bottom metal layer over said separating layer and on said first and second contact points, and electroplated copper directly over and in physical contact with said bottom metal layer;
a first metal post on and in physical contact with said patterned circuit layer, wherein said first metal post is connected to said first contact point through said patterned circuit layer, wherein said first metal post is not vertically over said first contact point, wherein said first metal post comprises electroplated copper and has a height between 25 and 200 micrometers;
a second metal post on and in physical contact with said patterned circuit layer, wherein said second metal post is connected to said second contact point through said patterned circuit layer, wherein said second metal post is not vertically over said second contact point, wherein said second metal post comprises electroplated copper and has a height between 25 and 200 micrometers, wherein a pitch between said first and second metal posts is less than 250 micrometers; and
a first polymer layer over said separating layer and on said patterned circuit layer, wherein said first metal post is in said first polymer layer and has a top surface not covered by said first polymer layer, and wherein said second metal post is in said first polymer layer and has a top surface not covered by said first polymer layer, wherein said top surface of said first metal post and said top surface of said second metal post are substantially coplanar with a top surface of said first polymer layer.

7. The integrated circuit chip of claim 6 further comprising a second polymer layer on said separating layer, wherein said patterned circuit layer and said first polymer layer are further on said second polymer layer.

8. The integrated circuit chip of claim 6, wherein said bottom metal layer comprises titanium.

9. The integrated circuit chip of claim 6, wherein said bottom metal layer comprises copper.

10. The integrated circuit chip of claim 6 further comprising a second polymer layer on said first polymer layer, wherein a third opening in said second polymer layer is over said top surface of said first metal post, and a fourth opening in said second polymer layer is over said top surface of said second metal post.

11. An integrated circuit chip comprising:
a substrate;
a MOS device on said substrate;
a contact pad over said substrate;
a passivation layer over said substrate, wherein an opening in said passivation layer is over a contact point of said contact pad, and said contact point is at a bottom of said opening, wherein said passivation layer comprises a nitride;
a patterned circuit layer over said passivation layer and on said contact point, wherein said patterned circuit layer is connected to said contact point through said opening, wherein said patterned circuit layer comprises a bottom metal layer over said passivation layer and on said contact point, and electroplated copper directly over and in physical contact with said bottom metal layer;
a metal post on and in physical contact with said patterned circuit layer, wherein said metal post is connected to said contact point through said patterned circuit layer, wherein said metal post is not vertically over said contact point, wherein said metal post comprises electroplated copper and has a height between 25 and 200 micrometers;
a first polymer layer over said passivation layer and on said patterned circuit layer, wherein said metal post is in said first polymer layer and has a top surface not covered by said first polymer layer, wherein said top surface of said metal post is substantially coplanar with a top surface of said first polymer layer;
a UBM layer on said top surface of said metal post; and
an electroplated solder bump on said UBM layer and vertically over said top surface of said metal post, wherein said integrated circuit chip has a pin count of greater than 400.

12. The integrated circuit chip of claim 11, wherein said UBM layer comprises titanium.

13. The integrated circuit chip of claim 11 further comprising a second polymer layer on said passivation layer, wherein said patterned circuit layer and said first polymer layer are further on said second polymer layer.

14. The integrated circuit chip of claim 11, wherein said bottom metal layer comprises titanium.

15. The integrated circuit chip of claim 11, wherein said bottom metal layer comprises copper.

16. An integrated circuit chip comprising:
a substrate;
a MOS device on said substrate;
a first contact pad over said substrate;
a second contact pad over said substrate;
a passivation layer over said substrate, wherein a first opening in said passivation layer is over a first contact point of said first contact pad, and said first contact point is at a bottom of said first opening, and wherein a second opening in said passivation layer is over a second contact point of said second contact pad, and said second contact point is at a bottom of said second opening, wherein said passivation layer comprises a nitride;
a patterned circuit layer over said passivation layer and on said first and second contact points, wherein said patterned circuit layer is connected to said first contact point through said first opening, and said patterned circuit layer is connected to said second contact point through said second opening, wherein said patterned circuit layer comprises a bottom metal layer over said passivation layer and on said first and second contact points, and electroplated copper directly over and in physical contact with said bottom metal layer;

a first metal post on and in physical contact with said patterned circuit layer, wherein said first metal post is connected to said first contact point through said patterned circuit layer, wherein said first metal post is not vertically over said first contact point, wherein said first metal post comprises electroplated copper and has a height between 25 and 200 micrometers;

a second metal post on and in physical contact with said patterned circuit layer, wherein said second metal post is connected to said second contact point through said patterned circuit layer, wherein said second metal post is not vertically over said second contact point, wherein said second metal post comprises electroplated copper and has a height between 25 and 200 micrometers, wherein a pitch between said first and second metal posts is less than 250 micrometers; and a first polymer layer over said passivation layer and on said patterned circuit layer, wherein said first metal post is in said first polymer layer and has a top surface not covered by said first polymer layer, and wherein said second metal post is in said first polymer layer and has a top surface not covered by said first polymer layer, wherein said top surface of said first metal post and said top surface of said second metal post are substantially coplanar with a top surface of said first polymer layer, wherein said integrated circuit chip has a pin count of greater than 400.

17. The integrated circuit chip of claim 16 further comprising a second polymer layer on said first polymer layer, wherein a third opening in said second polymer layer is over said top surface of said first metal post, and a fourth opening in said second polymer layer is over said top surface of said second metal post.

18. The integrated circuit chip of claim 16 further comprising a second polymer layer on said passivation layer, wherein said patterned circuit layer and said first polymer layer are further on said second polymer layer.

19. The integrated circuit chip of claim 16, wherein said bottom metal layer comprises titanium.

20. The integrated circuit chip of claim 16, wherein said bottom metal layer comprises copper.

* * * * *